(12) United States Patent
Calafiore

(10) Patent No.: US 10,809,448 B1
(45) Date of Patent: Oct. 20, 2020

(54) REDUCING DEMOLDING STRESS AT EDGES OF GRATINGS IN NANOIMPRINT LITHOGRAPHY

(71) Applicant: Facebook Technologies, LLC, Menlo Park, CA (US)

(72) Inventor: Giuseppe Calafiore, Redmond, WA (US)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/388,487

(22) Filed: Apr. 18, 2019

(51) Int. Cl.
- *F21V 8/00* (2006.01)
- *G03F 7/00* (2006.01)
- *G02B 27/01* (2006.01)

(52) U.S. Cl.
CPC ......... *G02B 6/0065* (2013.01); *G02B 6/0016* (2013.01); *G02B 6/0035* (2013.01); *G02B 27/0172* (2013.01); *G03F 7/0002* (2013.01)

(58) Field of Classification Search
CPC .. G02B 6/0065; G02B 6/0016; G02B 6/0035; G02B 6/0036; G02B 6/0038; G02B 27/0172; G02B 27/0174; G02B 27/0178; G03F 7/0002
USPC .......................................................... 385/37
See application file for complete search history.

(56) References Cited

U.S. PATENT DOCUMENTS

| | | | | |
|---|---|---|---|---|
| 5,300,169 | A * | 4/1994 | Tahara | G03H 1/0236 156/230 |
| 5,918,366 | A * | 7/1999 | Mori | B23P 15/00 29/888.42 |
| 6,545,808 | B1 * | 4/2003 | Ehbets | G02B 5/1857 359/15 |
| 8,444,907 | B2 * | 5/2013 | Ermochkine | B29C 35/0894 264/496 |
| 8,557,612 | B2 * | 10/2013 | Henry | B81C 1/00031 216/62 |
| 9,373,742 | B2 * | 6/2016 | Liang | H01L 31/18 |
| 9,513,480 | B2 * | 12/2016 | Saarikko | G02B 6/0016 |
| 9,946,072 | B2 * | 4/2018 | Vallius | G02B 27/0081 |
| 10,317,677 | B2 * | 6/2019 | Levola | G02B 27/0172 |

(Continued)

FOREIGN PATENT DOCUMENTS

| | | |
|---|---|---|
| EP | 1160589 | 12/2001 |
| JP | 2006032573 A | 2/2006 |

OTHER PUBLICATIONS

International Application No. PCT/US2019/028292, International Search Report and Written Opinion dated Jan. 27, 2020, 14 pages.

*Primary Examiner* — Robert Tavlykaev
(74) *Attorney, Agent, or Firm* — Weaver Austin Villeneuve & Sampson LLP

(57) ABSTRACT

A nano-structure includes an outer area at an edge of the nano-structure. A width of the outer area defined by a distance from the edge of the nano-structure is less than 100 µm. A depth of the nano-structure in the outer area changes gradually between 0% and at least 50% of a maximum depth of the nano-structure. A method includes forming an etch mask on a substrate and etching the substrate with the etch mask using an ion beam to form a nano-structure in the substrate. The etch mask includes an outer area near an edge of the etch mask. A width of the outer area defined by a distance from the edge of the etch mask is less than 100 µm. A duty cycle of the etch mask in the outer area changes gradually between at least 10% and at least 90%.

20 Claims, 18 Drawing Sheets

(56) References Cited

U.S. PATENT DOCUMENTS

| | | | |
|---|---|---|---|
| 10,534,121 B2* | 1/2020 | Hiraoka | G03H 1/0248 |
| 2008/0303187 A1 | 12/2008 | Stacey et al. | |
| 2009/0053656 A1 | 2/2009 | Yanagisawa | |
| 2010/0252188 A1 | 10/2010 | Inanami et al. | |
| 2012/0268821 A1* | 10/2012 | Miyazawa | B29C 35/16 |
| | | | 359/576 |
| 2013/0207309 A1* | 8/2013 | Okada | B29C 33/44 |
| | | | 264/293 |
| 2014/0072668 A1 | 3/2014 | Yoneda et al. | |
| 2015/0252414 A1 | 9/2015 | Bai et al. | |
| 2015/0355394 A1 | 12/2015 | Valera et al. | |
| 2016/0149646 A1* | 5/2016 | Sorin | G02B 5/1842 |
| | | | 398/200 |
| 2016/0231478 A1* | 8/2016 | Kostamo | G02B 5/1857 |
| 2017/0075047 A1* | 3/2017 | Miyazawa | B29C 43/52 |
| 2017/0235219 A1* | 8/2017 | Kostamo | G03F 7/0002 |
| | | | 264/40.1 |
| 2018/0021987 A1 | 1/2018 | Guan et al. | |
| 2018/0095201 A1 | 4/2018 | Melli et al. | |
| 2018/0217311 A1* | 8/2018 | Hiraoka | G02B 27/021 |
| 2019/0224948 A1* | 7/2019 | Frebourg | B32B 17/1099 |
| 2019/0369321 A1* | 12/2019 | Young | G02B 6/0065 |

* cited by examiner

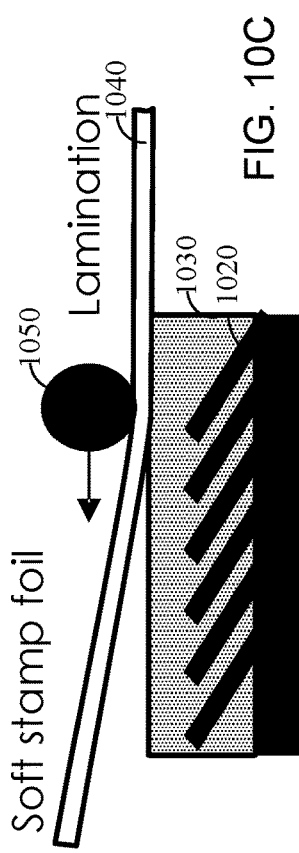
FIG. 10A
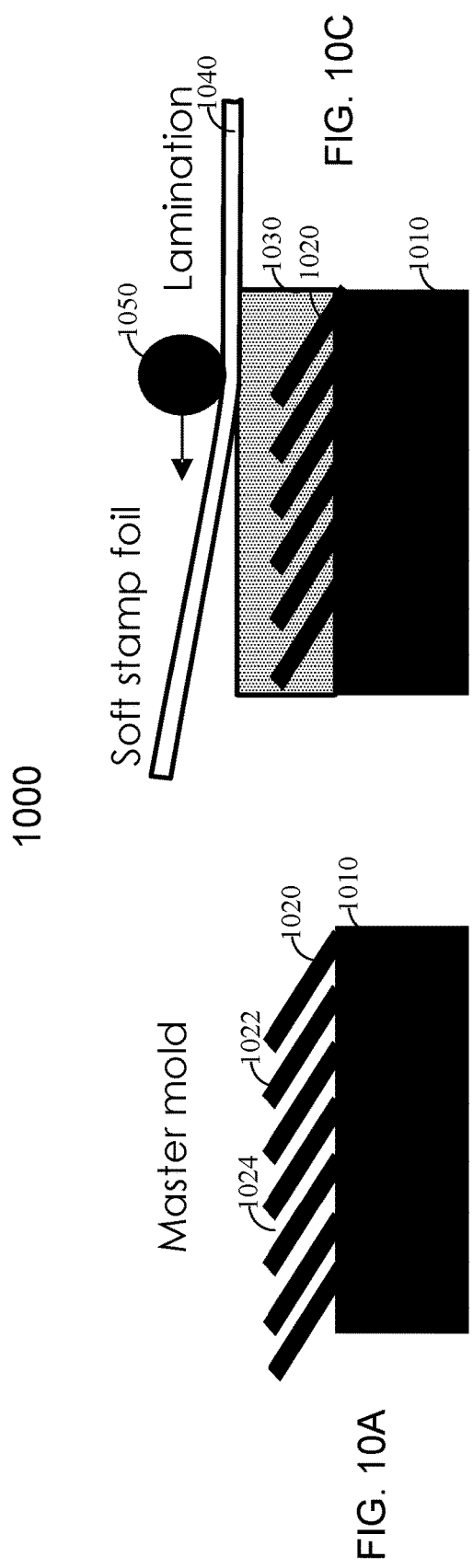
FIG. 10B
FIG. 10C
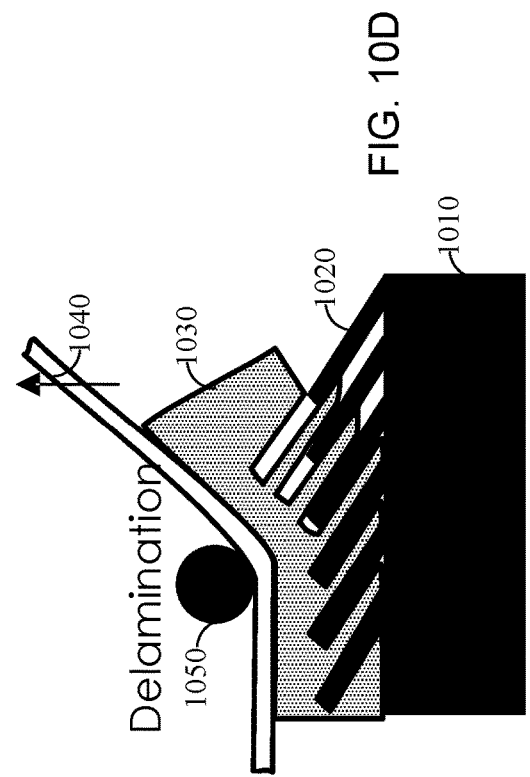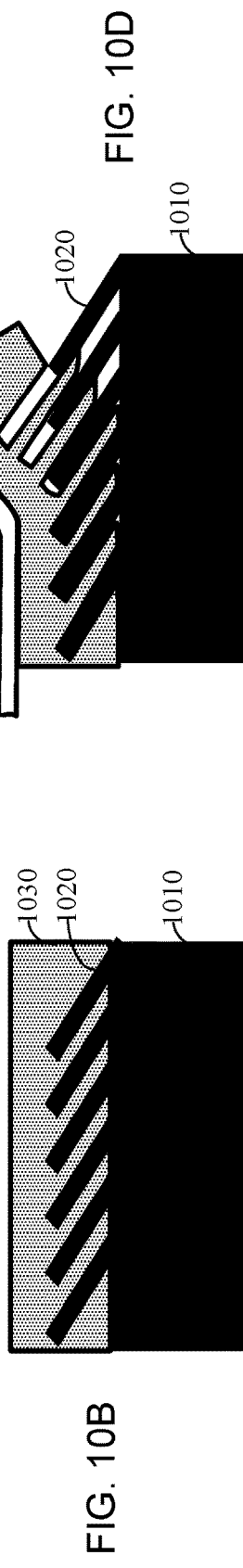
FIG. 10D

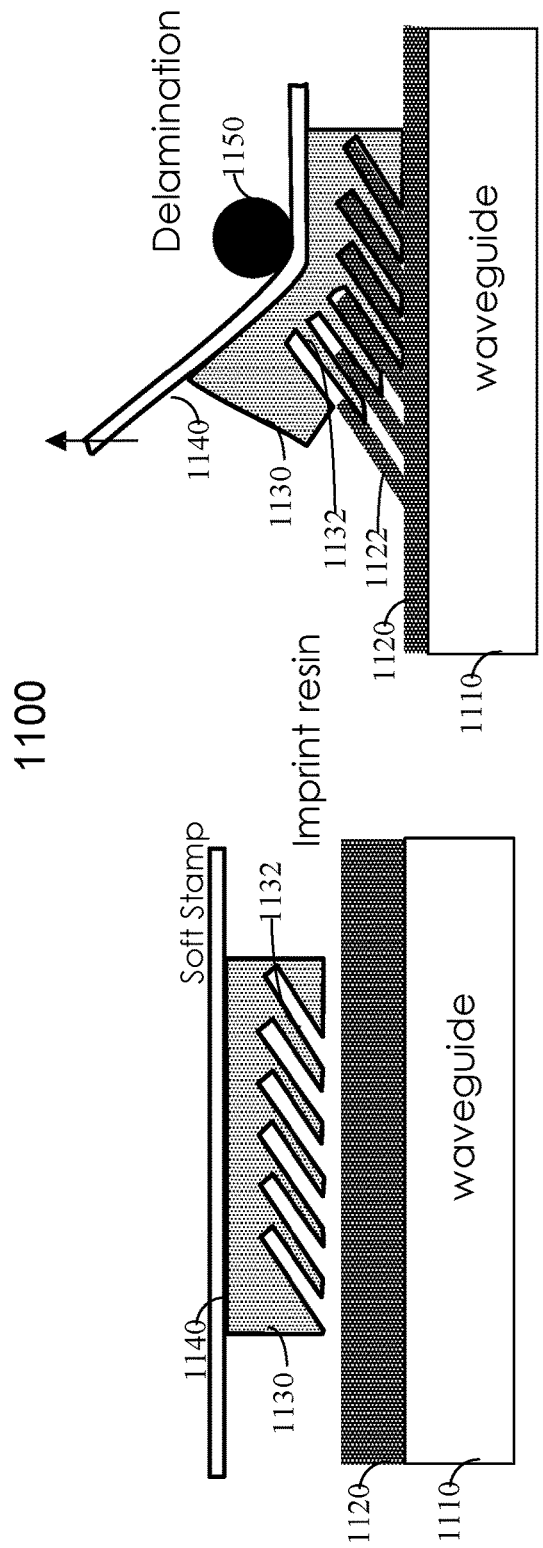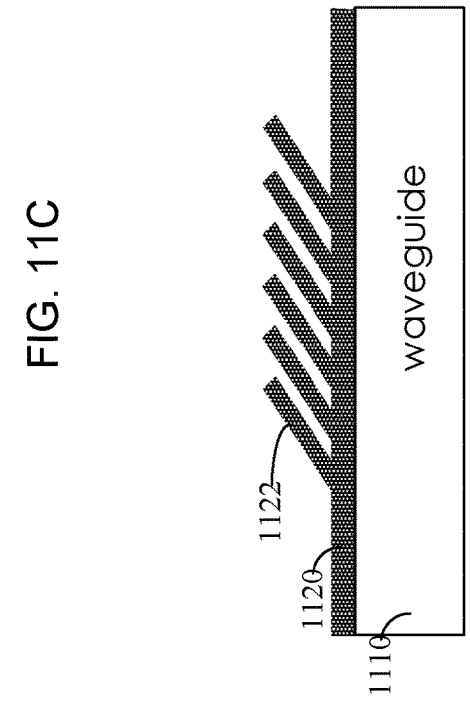

REDUCING DEMOLDING STRESS AT EDGES OF GRATINGS IN NANOIMPRINT LITHOGRAPHY

BACKGROUND

An artificial reality system, such as a head-mounted display (HMD) or heads-up display (HUD) system, generally includes a display configured to present artificial images that depict objects in a virtual environment. The display may display virtual objects or combine real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through).

One example optical see-through AR system may use a waveguide-based optical display, where light of projected images may be coupled into a waveguide (e.g., a substrate), propagate within the waveguide, and be coupled out of the waveguide at different locations. In some implementations, the light may be coupled out of the waveguide using a diffractive optical element, such as a grating. The grating may diffract both the light of the projected image and light from the surrounding environment (e.g., from a light source, such as a lamp). The diffracted light from the surrounding environment may appear as a ghost image to the user of the AR system. In addition, due to the wavelength dependent characteristics of the grating, ghost images of different colors may appear at different locations or angles. These ghost images may negatively impact the user experience of using an artificial reality system.

SUMMARY

This disclosure relates generally to waveguide-based near-eye display systems. More specifically, this disclosure relates to nanoimprint lithography (NIL) molding techniques for manufacturing surface-relief structures, such as straight or slanted surface-relief gratings used in a near-eye display system.

In NIL molding, an NIL mold (e.g., a soft stamp or any other working stamp having a nano-structure) may be pressed against an NIL resin layer for molding a nano-structure (e.g., a grating) in the NIL resin layer. To limit damage of the nano-structures of the NIL mold and the imprinted resin layer during demolding, in some embodiments, the depth of the nano-structure of the NIL mold may gradually change at the edges of the NIL mold. The edge area having the gradual depth change may be small so as to reduce the effect of the gradual depth change in the imprinted nano-structure on the performance of the imprinted nano-structure.

In some embodiments, reactive ion etch (RIE) lag effect may be utilized to etch nano-structures with a large gradual depth change in a small area near the edges of the nano-structures (e.g., in a master mold). The etch mask used for etching the nanostructure in the master mold may be modified to include a large gradual change in duty cycle in a small area such that a large change in etch depth in a small area in the etched nano-structure in the master mold can be achieved due to the RIE lag effect. The master mold may then be used to produce soft stamps and/or surface-relief structures having nanostructures having a large change in depth in a small area.

In some embodiments, a nano-structure may include an outer area at an edge of the nano-structure. A width of the outer area defined by a distance from the edge of the nano-structure may be less than 100 μm. A depth of the nano-structure in the outer area may change gradually between 0% and at least 50% of a maximum depth of the nano-structure.

In some embodiments, the depth of the nano-structure in the outer area may gradually decrease towards the edge of the nano-structure. In some embodiments, the maximum depth of the nano-structure may be at least 100 nm. In some embodiments, the depth of the nano-structure in the outer area may gradually change from 400 nm or less to 5 nm or less.

In some embodiments, the nano-structure may include a plurality of ridges and a plurality of trenches each defined by two adjacent ridges. The depth of the nano-structure may be defined by a depth of each of the plurality of trenches. The depth of at least one trench of the plurality of trenches may change gradually in the outer area between 0% and at least 50% of a maximum depth of the at least one trench. In some embodiments, at least one of the plurality of ridges may have a slant angle of greater than 30°, greater than 45°, or greater than 60°.

In some embodiments, the nano-structure may include a surface-relief grating configured to couple light into and/or out of a substrate, and wherein the surface-relief grating may include a resin. In some embodiments, the nano-structure may include a mold for nano-imprint lithography, and the mold may include a resin. In some embodiments, the nano-structure may include a mold for nano-imprint lithography, and the mold may include a semiconductor, an oxide, or a metal.

In some embodiments, a duty cycle of the nano-structure in the outer area may change gradually between at least 10% and at least 90%. In some embodiments, the duty cycle of the nano-structure may gradually increase towards the edge of the nano-structure. In some embodiments, the outer area surrounds less than an entire periphery of the nano-structure.

In some embodiments, a method may include forming an etch mask on a substrate and etching the substrate with the etch mask using an ion beam to form a nano-structure in the substrate. The etch mask may include an outer area near an edge of the etch mask. A width of the outer area defined by a distance from the edge of the etch mask may be less than 100 μm. A duty cycle of the etch mask in the outer area may change gradually between at least 10% and at least 90%.

In some embodiments, the duty cycle of the etch mask may gradually increase towards the edge of the etch mask. In some embodiments, an etch depth in the substrate may gradually decrease towards an edge of the nano-structure. In some embodiments, the etch depth may decrease from 400 nm or less to 5 nm towards the edge of the nano-structure.

In some embodiments, the substrate may include a semiconductor, an oxide, or a metal. The method may further include forming a stamp using the nano-structure in the substrate, and the stamp may include a resin. In some embodiments, the method may further include forming a surface-relief grating using the stamp. A depth of the surface-relief grating may decrease gradually towards an edge of the surface-relief grating. In some embodiments, the surface-relief grating may include a plurality of ridges and a plurality of trenches each defined by two adjacent ridges. The depth of the surface-relief grating may be defined by a depth of each of the plurality of trenches. The depth of at least one trench of the plurality of trenches may gradually decrease in the outer area from at least 50% to 0% of a maximum depth of the at least one trench. In some embodiments, at least one of the plurality of ridges may have a slant angle of greater than 30°, greater than 45°, or greater than 60°.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

FIG. 9A shows a molding process. FIG. 9B shows a demolding process.

FIGS. 10A-10D illustrate an example process for fabricating a soft stamp used to make a slanted surface-relief grating according to certain embodiments. FIG. 10A shows a master mold. FIG. 10B illustrates the master mold coated with a soft stamp material layer. FIG. 10C illustrates a lamination process for laminating a soft stamp foil onto the soft stamp material layer.

FIG. 10D illustrates a delamination process, where the soft stamp including the soft stamp foil and the attached soft stamp material layer is detached from the master mold.

FIGS. 11A-11D illustrate an example process for fabricating a slanted surface-relief grating using a soft stamp according to certain embodiments. FIG. 11A shows a waveguide coated with an imprint resin layer. FIG. 11B shows the lamination of the soft stamp onto the imprint resin layer. FIG. 11C shows the delamination of the soft stamp from the imprint resin layer. FIG. 11D shows an example of an imprinted slanted grating formed on the waveguide.

Figure 1:
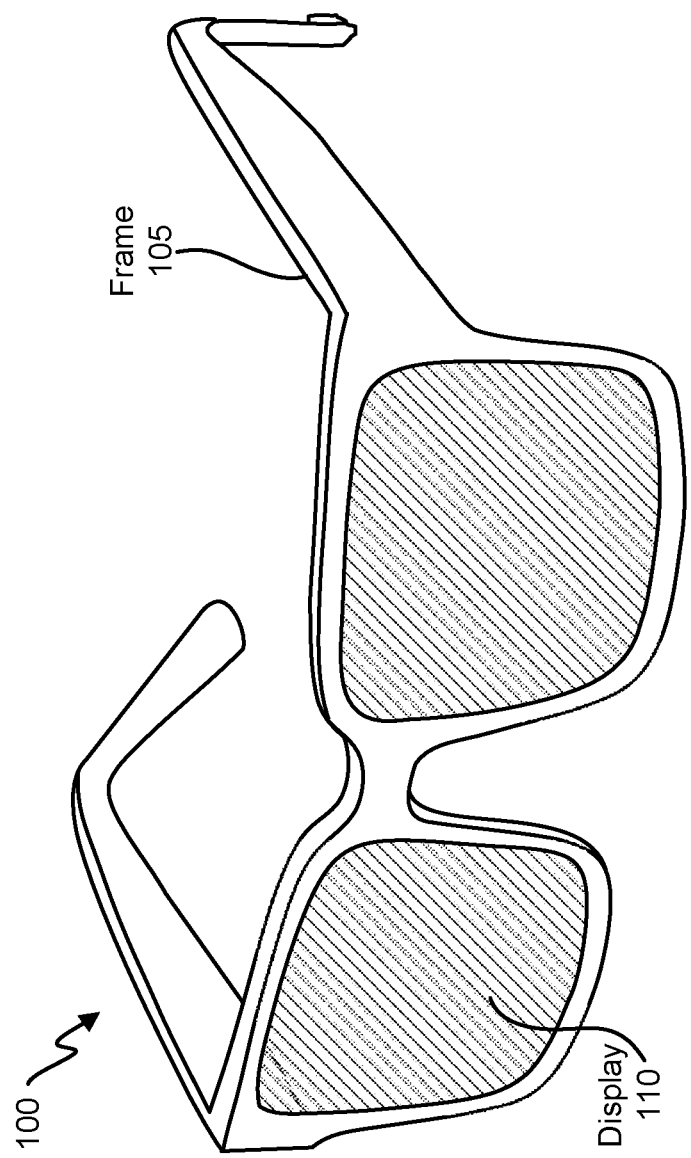
FIG. 1 is a simplified diagram of an example near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates generally to waveguide-based near-eye display system. More specifically, this disclosure relates to nanoimprint techniques for manufacturing surface-relief structures, such as straight or slanted surface-relief gratings used in a near-eye display system. The surface-relief structures may be fabricated using many different nanofabrication techniques. For example, in some implementations, the surface-relief structures may be fabricated using lithography and etching techniques. In some implementations, the surface-relief structures may be fabricated using nanoimprint lithography (NIL) molding techniques. NIL molding may significantly reduce the cost of the surface-relief structures.

In NIL molding, a substrate may be coated with an NIL resin layer. An NIL mold (e.g., a soft stamp including a polymeric material or any other working stamp) with straight or slanted structures may be pressed against the NIL resin layer for molding a grating in the NIL resin layer. A soft stamp (e.g., made of polymers) may offer more flexibility during the molding and demolding processes. The NIL resin layer may be cured subsequently using, for example, heat and/or ultraviolet (UV) light. The NIL mold may then be detached or delaminated from the NIL resin layer, and structures that are complementary to the structures of the NIL mold may be formed in the NIL resin layer.

During delamination (or demolding) of the soft stamp, a delamination front or crack may be created between surfaces of the soft stamp and the NIL resin layer. At the beginning of the demolding, the delamination front or crack may uniformly propagate at a flat interface between the soft stamp and the NIL resin layer because there may not be nano-structures at edges of the soft stamp. However, when the delamination front or crack reaches the edges of the nano-structures, the stress in the nano-structures of the soft stamp or the resin layer may change suddenly as the contact surface area between the soft stamp and the NIL resin layer may increase suddenly due to the nano-structures. As such, the nano-structures on the soft stamp or the resin layer may be damaged due to the stress.

Thus, it may be desirable to have a gradual change in the depth of the nano-structures at the edges of the soft stamp. In addition, it may be desirable that the edge area having the gradual change in the depth of the nano-structures is small in order to reduce the effect of the gradual change in the depth of the nano-structures on the performance of the nano-structures, such as straight or slanted surface-relief gratings. However, it may be challenging to fabricate a master mold having nano-structures with a large gradual depth change in a small area at (e.g., within about 0.1-100 μm from) the edges of the nano-structures using existing etching techniques.

According to certain embodiments, to etch nano-structures with a large gradual depth change in a small area near the edges of the nano-structures (e.g., in a master mold), the edges of the mask used for etching the master mold may be modified to include a large gradual change in duty cycle in a small area. When the mask is used for etching the nano-structure, the reactive ion etch (RIE) lag effect may cause the areas with different duty cycles to be etched at different rates and therefore have different depths. For example, areas with larger duty cycles (narrower trenches) may be etched at lower rates because of mean free path shortening and more ineffective transport of the etched species. On the other hand, areas with smaller duty cycles (wide trenches) may be etched at faster rates because it is easier to remove the etched species when the duty cycles are small. As such, a large gradual change in duty cycle in a small area on the mask corresponding to the edges of the nano-structure in the master mold may cause a large gradual depth change in a small area near the edges of the etched nano-structure. In this way, the stress may change gradually within a short distance near the edges of the nano-structure to avoid a sudden change and damage of the imprinted nano-structure or the working stamp.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof.

FIG. 1 is a simplified diagram of an example near-eye display 100 according to certain embodiments. Near-eye display 100 may present media to a user. Examples of media presented by near-eye display 100 may include one or more images, video, and/or audio. In some embodiments, audio may be presented via an external device (e.g., speakers and/or headphones) that receives audio information from near-eye display 100, a console, or both, and presents audio data based on the audio information. Near-eye display 100 is generally configured to operate as an artificial reality display. In some embodiments, near-eye display 100 may operate as an augmented reality (AR) display or a mixed reality (MR) display.

Near-eye display 100 may include a frame 105 and a display 110. Frame 105 may be coupled to one or more optical elements. Display 110 may be configured for the user to see content presented by near-eye display 100. In some embodiments, display 110 may include a waveguide display assembly for directing light from one or more images to an eye of the user.

Figure 2:
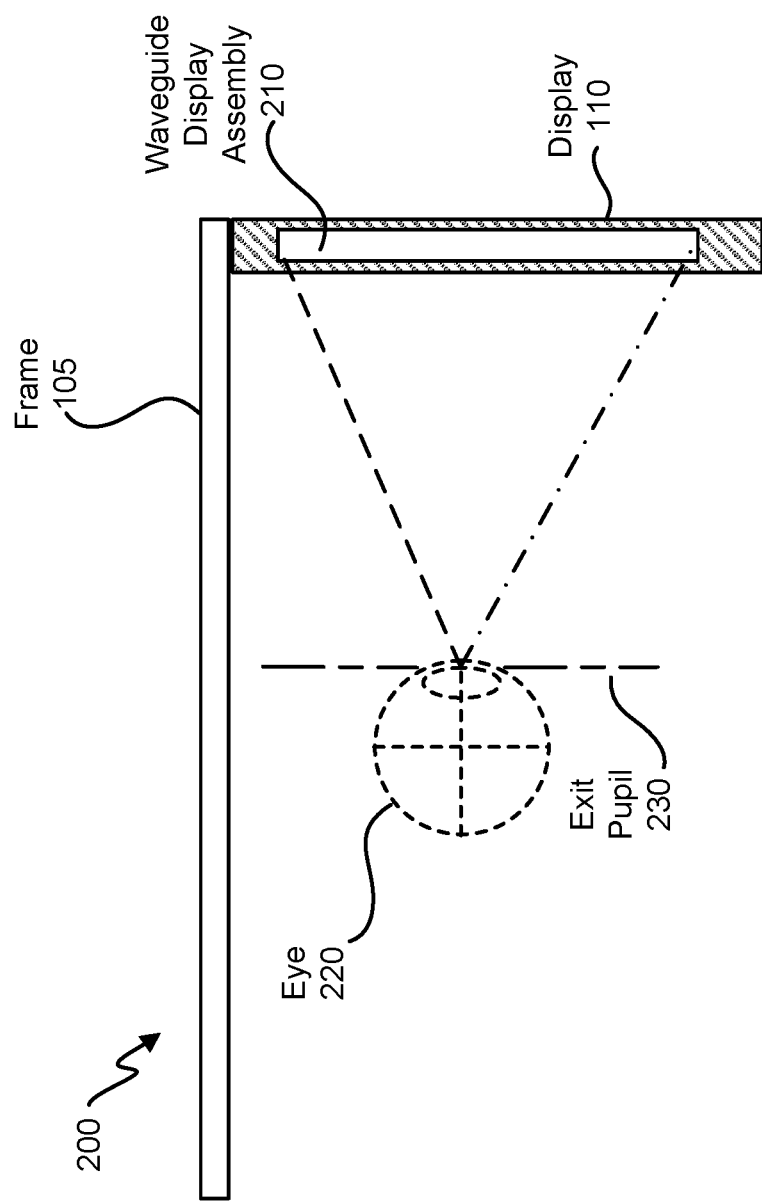
FIG. 2 is a cross-sectional view of an example near-eye display according to certain embodiments.

FIG. 2 is a cross-sectional view 200 of near-eye display 100 illustrated in FIG. 1. Display 110 may include may include at least one waveguide display assembly 210. An exit pupil 230 may be located at a location where a user's eye 220 is positioned when the user wears near-eye display 100. For purposes of illustration, FIG. 2 shows cross-section sectional view 200 associated with user's eye 220 and a single waveguide display assembly 210, but, in some embodiments, a second waveguide display may be used for the second eye of the user.

Waveguide display assembly 210 may be configured to direct image light (i.e., display light) to an eyebox located at exit pupil 230 and to user's eye 220. Waveguide display assembly 210 may include one or more materials (e.g., plastic, glass, etc.) with one or more refractive indices. In some embodiments, near-eye display 100 may include one or more optical elements between waveguide display assembly 210 and user's eye 220.

In some embodiments, waveguide display assembly 210 may include a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display may also be a polychromatic display that can be projected on multiple planes (e.g. multi-planar colored display). In some configurations, the stacked waveguide display may be a monochromatic display that can be projected on multiple planes (e.g. multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
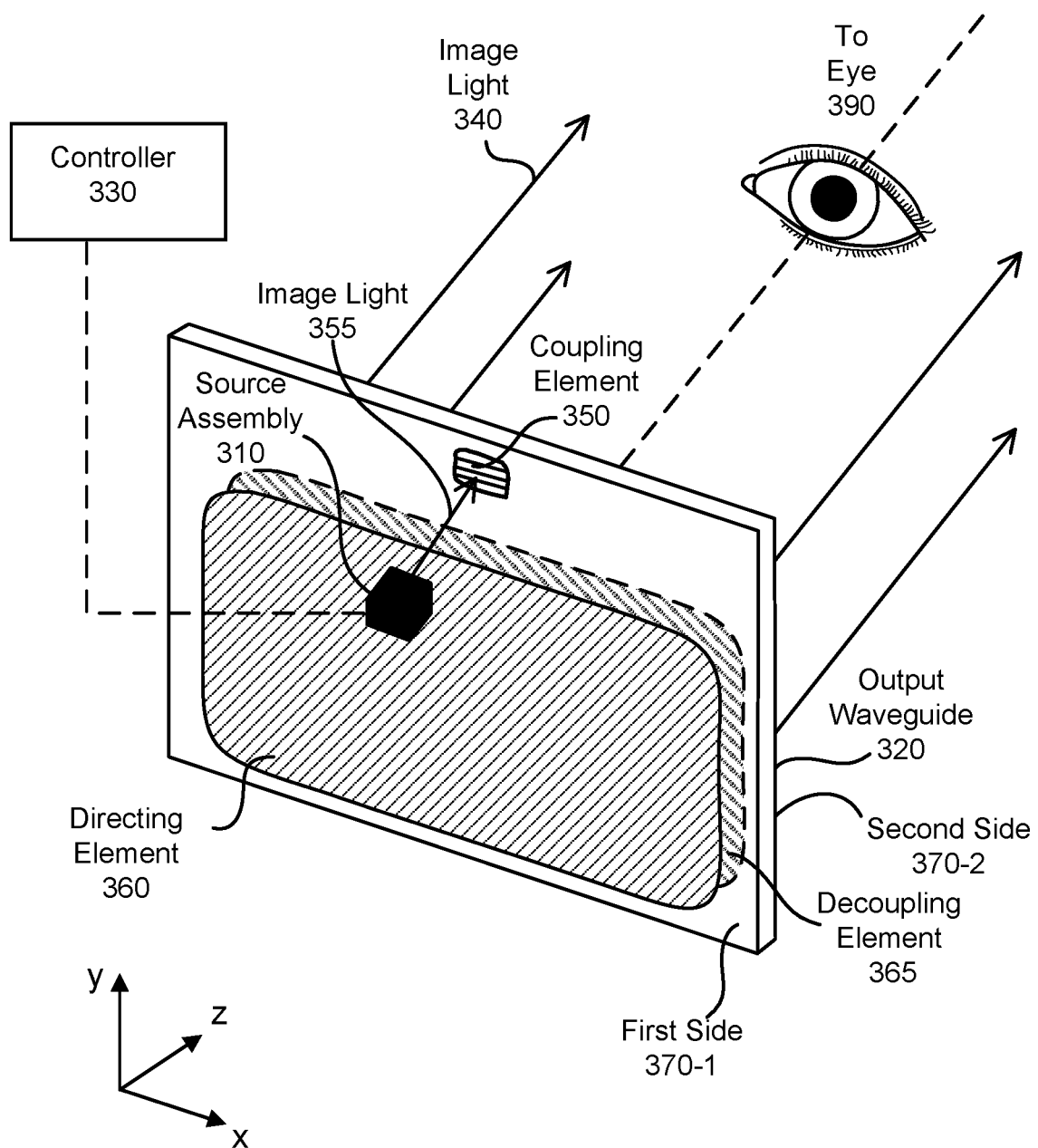
FIG. 3 is an isometric view of an example waveguide display according to certain embodiments.

FIG. 3 is an isometric view of an embodiment of a waveguide display 300. In some embodiments, waveguide display 300 may be a component (e.g., waveguide display assembly 210) of near-eye display 100. In some embodiments, waveguide display 300 may be part of some other near-eye displays or other systems that may direct image light to a particular location.

Waveguide display 300 may include a source assembly 310, an output waveguide 320, and a controller 330. For purposes of illustration, FIG. 3 shows waveguide display 300 associated with a user's eye 390, but in some embodiments, another waveguide display separate, or partially separate, from waveguide display 300 may provide image light to another eye of the user.

Source assembly 310 may generate image light 355 for display to the user. Source assembly 310 may generate and output image light 355 to a coupling element 350 located on a first side 370-1 of output waveguide 320. In some embodiments, coupling element 350 may couple image light 355 from source assembly 310 into output waveguide 320. Coupling element 350 may include, for example, a diffraction grating, a holographic grating, one or more cascaded reflectors, one or more prismatic surface elements, and/or an array of holographic reflectors. Output waveguide 320 may be an optical waveguide that can output expanded image light 340 to user's eye 390. Output waveguide 320 may receive image light 355 at one or more coupling elements 350 located on first side 370-1 and guide received image light 355 to a directing element 360.

Directing element 360 may redirect received input image light 355 to decoupling element 365 such that received input image light 355 may be coupled out of output waveguide 320 via decoupling element 365. Directing element 360 may be part of, or affixed to, first side 370-1 of output waveguide 320. Decoupling element 365 may be part of, or affixed to, a second side 370-2 of output waveguide 320, such that directing element 360 is opposed to decoupling element 365. Directing element 360 and/or decoupling element 365 may include, for example, a diffraction grating, a holographic grating, a surface-relief grating, one or more cascaded reflectors, one or more prismatic surface elements, and/or an array of holographic reflectors.

Second side 370-2 of output waveguide 320 may represent a plane along an x-dimension and a y-dimension. Output waveguide 320 may include one or more materials that can facilitate total internal reflection of image light 355. Output waveguide 320 may include, for example, silicon, plastic, glass, and/or polymers. Output waveguide 320 may have a relatively small form factor. For example, output waveguide 320 may be approximately 50 mm wide along the x-dimension, about 30 mm long along the y-dimension, and about 0.5 to 1 mm thick along a z-dimension.

Controller 330 may control scanning operations of source assembly 310. Controller 330 may determine scanning instructions for source assembly 310. In some embodiments, output waveguide 320 may output expanded image light 340 to user's eye 390 with a large field of view (FOV). For example, expanded image light 340 provided to user's eye 390 may have a diagonal FOV (in x and y) of about 60 degrees or greater and/or about 150 degrees or less. Output waveguide 320 may be configured to provide an eyebox with a length of about 20 mm or greater and/or equal to or less than about 50 mm, and/or a width of about 10 mm or greater and/or equal to or less than about 50 mm.

Figure 4:
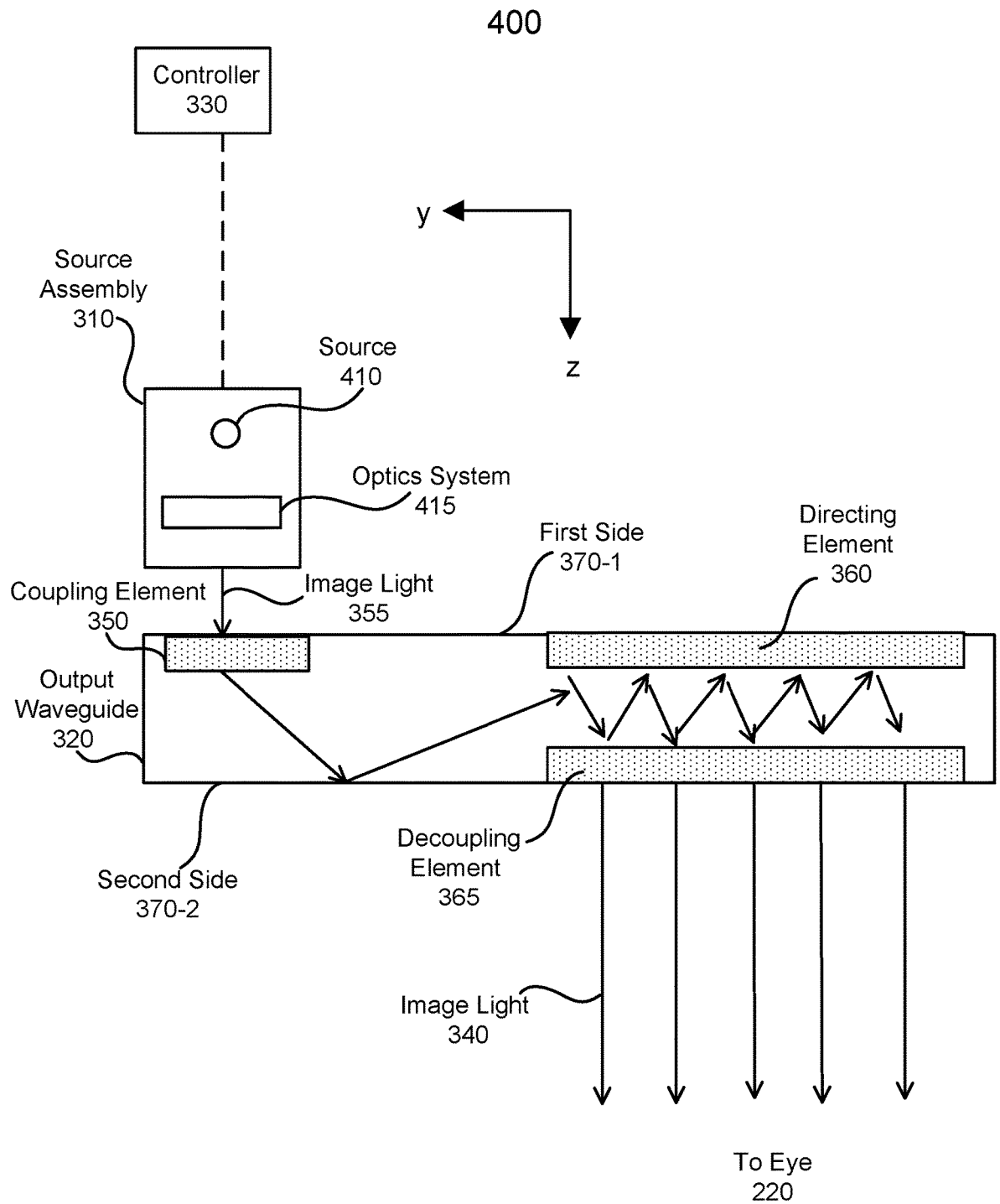
FIG. 4 is a cross-sectional view of an example waveguide display according to certain embodiments.

FIG. 4 is a cross-sectional view 400 of the waveguide display 300. Waveguide display 300 may include source assembly 310 and output waveguide 320. Source assembly 310 may generate image light 355 (i.e., display light) in accordance with scanning instructions from controller 330. Source assembly 310 may include a source 410 and an optics system 415. Source 410 may include a light source that generates coherent or partially coherent light. Source 410 may include, for example, a laser diode, a vertical cavity surface emitting laser, and/or a light emitting diode.

Optics system 415 may include one or more optical components that can condition the light from source 410. Conditioning light from source 410 may include, for example, expanding, collimating, and/or adjusting orientation in accordance with instructions from controller 330. The one or more optical components may include one or more lenses, liquid lenses, mirrors, apertures, and/or gratings. Light emitted from optics system 415 (and also source assembly 310) may be referred to as image light 355 or display light.

Output waveguide 320 may receive image light 355 from source assembly 310. Coupling element 350 may couple image light 355 from source assembly 310 into output waveguide 320. In embodiments where coupling element 350 includes a diffraction grating, the diffraction grating may be configured such that total internal reflection may occur within output waveguide 320, and thus image light 355 coupled into output waveguide 320 may propagate internally within output waveguide 320 (e.g., by total internal reflection) toward decoupling element 365.

Directing element 360 may redirect image light 355 toward decoupling element 365 for coupling at least a portion of the image light out of output waveguide 320. In embodiments where directing element 360 is a diffraction grating, the diffraction grating may be configured to cause incident image light 355 to exit output waveguide 320 at angle(s) of inclination relative to a surface of decoupling element 365. In some embodiments, directing element 360 and/or the decoupling element 365 may be structurally similar, and may switch their roles for different portions of image light 355.

Expanded image light 340 exiting output waveguide 320 may be expanded along one or more dimensions (e.g., elongated along the x-dimension). In some embodiments, waveguide display 300 may include a plurality of source assemblies 310 and a plurality of output waveguides 320. Each of source assemblies 310 may emit a monochromatic image light corresponding to a primary color (e.g., red, green, or blue). Each of output waveguides 320 may be stacked together to output an expanded image light 340 that may be multi-colored.

Figure 5:
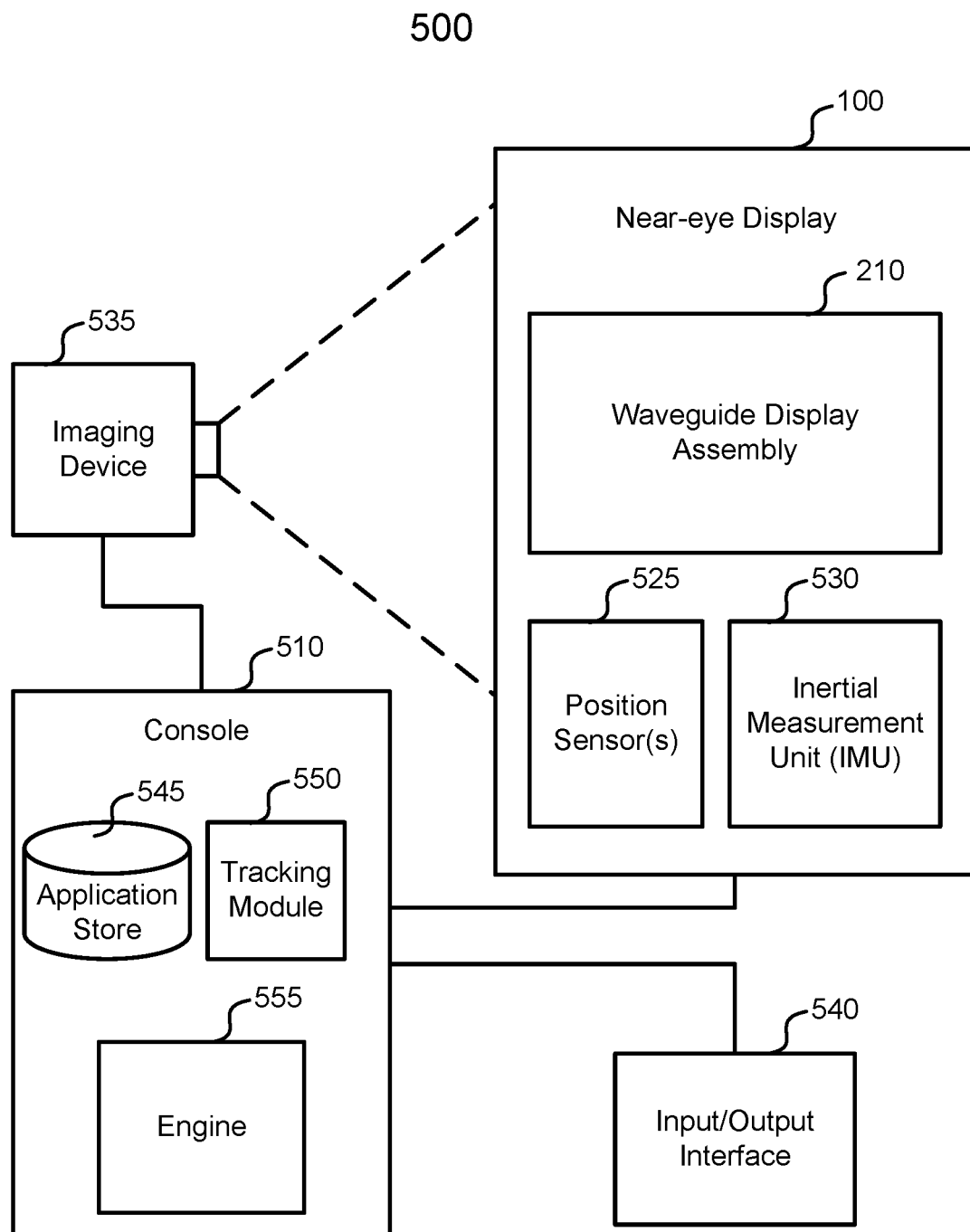
FIG. 5 is a simplified block diagram of an example artificial reality system including a waveguide display.

FIG. 5 is a simplified block diagram of an example artificial reality system 500 including waveguide display assembly 210. System 500 may include near-eye display 100, an imaging device 535, and an input/output interface 540 that are each coupled to a console 510.

As described above, near-eye display 100 may be a display that presents media to a user. Examples of media presented by near-eye display 100 may include one or more images, video, and/or audio. In some embodiments, audio may be presented via an external device (e.g., speakers and/or headphones) that may receive audio information from near-eye display 100 and/or console 510 and present audio data based on the audio information to a user. In some embodiments, near-eye display 100 may act as an artificial reality eyewear glass. For example, in some embodiments, near-eye display 100 may augment views of a physical, real-world environment, with computer-generated elements (e.g., images, video, sound, etc.).

Near-eye display 100 may include waveguide display assembly 210, one or more position sensors 525, and/or an inertial measurement unit (IMU) 530. Waveguide display assembly 210 may include source assembly 310, output waveguide 320, and controller 330, as described above.

IMU 530 may include an electronic device that can generate fast calibration data indicating an estimated position of near-eye display 100 relative to an initial position of near-eye display 100 based on measurement signals received from one or more position sensors 525.

Imaging device 535 may generate slow calibration data in accordance with calibration parameters received from console 510. Imaging device 535 may include one or more cameras and/or one or more video cameras.

Input/output interface 540 may be a device that allows a user to send action requests to console 510. An action request may be a request to perform a particular action. For example, an action request may be to start or end an application or to perform a particular action within the application.

Console 510 may provide media to near-eye display 100 for presentation to the user in accordance with information received from one or more of: imaging device 535, near-eye display 100, and input/output interface 540. In the example shown in FIG. 5, console 510 may include an application store 545, a tracking module 550, and an engine 555.

Application store 545 may store one or more applications for execution by the console 510. An application may include a group of instructions that, when executed by a processor, may generate content for presentation to the user. Examples of applications may include gaming applications, conferencing applications, video playback application, or other suitable applications.

Tracking module 550 may calibrate system 500 using one or more calibration parameters and may adjust one or more calibration parameters to reduce error in determination of the position of near-eye display 100. Tracking module 550 may track movements of near-eye display 100 using slow calibration information from imaging device 535. Tracking module 550 may also determine positions of a reference point of near-eye display 100 using position information from the fast calibration information.

Engine 555 may execute applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210. The signal may determine a type of content to present to the user.

There may be many different ways to implement the waveguide display. For example, in some implementations, output waveguide 320 may include a slanted surface between first side 370-1 and second side 370-2 for coupling image light 355 into output waveguide 320. In some implementations, the slanted surface may be coated with a reflective coating to reflect light towards directing element 360. In some implementations, the angle of the slanted surface may be configured such that image light 355 may be reflected by the slanted surface due to total internal reflection. In some implementations, directing element 360 may not be used, and light may be guided within output waveguide 320 by total internal reflection. In some implementations, decoupling elements 365 may be located near first side 370-1.

In some implementations, output waveguide 320 and decoupling element 365 (and directing element 360 if used) may be transparent to light from the environment, and may act as an optical combiner to combine image light 355 and light from the physical, real-world environment in front of near-eye display 100. As such, the user can view both artificial images of artificial objects from source assembly 310 and real images of real objects in the physical, real-world environment.

Figure 6:
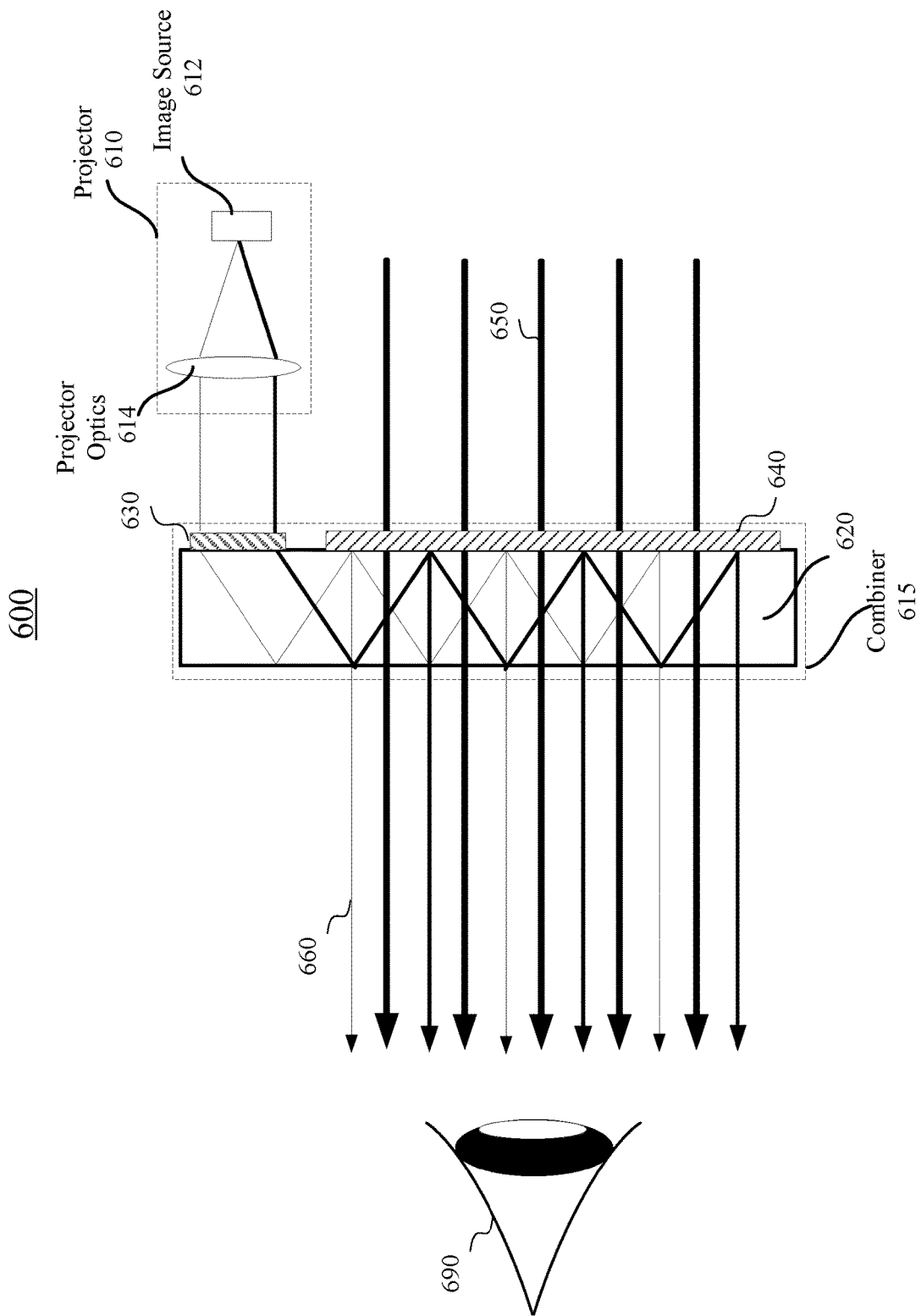
FIG. 6 illustrates an example optical see-through augmented reality system using a waveguide display according to certain embodiments.

FIG. 6 illustrates an example optical see-through augmented reality system 600 using a waveguide display according to certain embodiments. Augmented reality system 600 may include a projector 610 and a combiner 615. Projector 610 may include a light source or image source 612 and projector optics 614. In some embodiments, image source 612 may include a plurality of pixels that displays virtual objects, such as an LCD display panel or an LED display panel. In some embodiments, image source 612 may include a light source that generates coherent or partially coherent light. For example, image source 612 may include a laser diode, a vertical cavity surface emitting laser, and/or a light emitting diode. In some embodiments, image source 612 may include a plurality of light sources each emitting a monochromatic image light corresponding to a primary color (e.g., red, green, or blue). In some embodiments, image source 612 may include an optical pattern generator, such as a spatial light modulator. Projector optics 614 may include one or more optical components that can condition the light from image source 612, such as expanding, collimating, scanning, or projecting light from image source 612 to combiner 615. The one or more optical components may include one or more lenses, liquid lenses, mirrors, apertures, and/or gratings. In some embodiments, projector optics 614 may include a liquid lens (e.g., a liquid crystal lens) with a plurality of electrodes that allows scanning of the light from image source 612.

Combiner 615 may include an input coupler 630 for coupling light from projector 610 into a substrate 620 of combiner 615. Input coupler 630 may include a volume holographic grating, a diffractive optical elements (DOE) (e.g., a surface-relief grating), or a refractive coupler (e.g., a wedge or a prism). Input coupler 630 may have a coupling efficiency of greater than 30%, 50%, 75%, 90%, or higher for visible light. As used herein, visible light may refer to light with a wavelength between about 380 nm to about 750 nm. Light coupled into substrate 620 may propagate within substrate 620 through, for example, total internal reflection (TIR). Substrate 620 may be in the form of a lens of a pair of eyeglasses. Substrate 620 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 620 may be transparent to visible light. A material may be "transparent" to a light beam if the light beam can pass through the material with a high transmission rate, such as larger than 60%, 75%, 80%, 90%, 95%, or higher, where a small portion of the light beam (e.g., less than 60%, 25%, 20%, 10%, 5%, or less) may be scattered, reflected, or absorbed by the material. The transmission rate (i.e., transmissivity) may be represented by either a photopically weighted or an unweighted average transmission rate over a range of wavelengths, or the lowest transmission rate over a range of wavelengths, such as the visible wavelength range.

Substrate 620 may include or may be coupled to a plurality of output couplers 640 configured to extract at least a portion of the light guided by and propagating within substrate 620 from substrate 620 and direct extracted light 660 to an eye 690 of the user of augmented reality system 600. As input coupler 630, output couplers 640 may include grating couplers (e.g., volume holographic gratings or surface-relief gratings), prisms, or DOEs. Output couplers 640 may have different coupling (e.g., diffraction) efficiencies at different locations. Substrate 620 may also allow light 650 from environment in front of combiner 615 to pass through with little or no loss. Output couplers 640 may allow light 650 to pass through with little loss. For example, in some implementations, output couplers 640 may have a low diffraction efficiency for light 650 as described below such that light 650 may be refracted or otherwise pass through output couplers 640 with little loss. In some implementations, output couplers 640 may have a high diffraction efficiency for light 650 and may direct light 650 to certain desired directions (i.e., diffraction angles) with little loss. As a result, the user may be able to view combined images of the environment in front of combiner 615 and virtual objects projected by projector 610.

Figure 7:
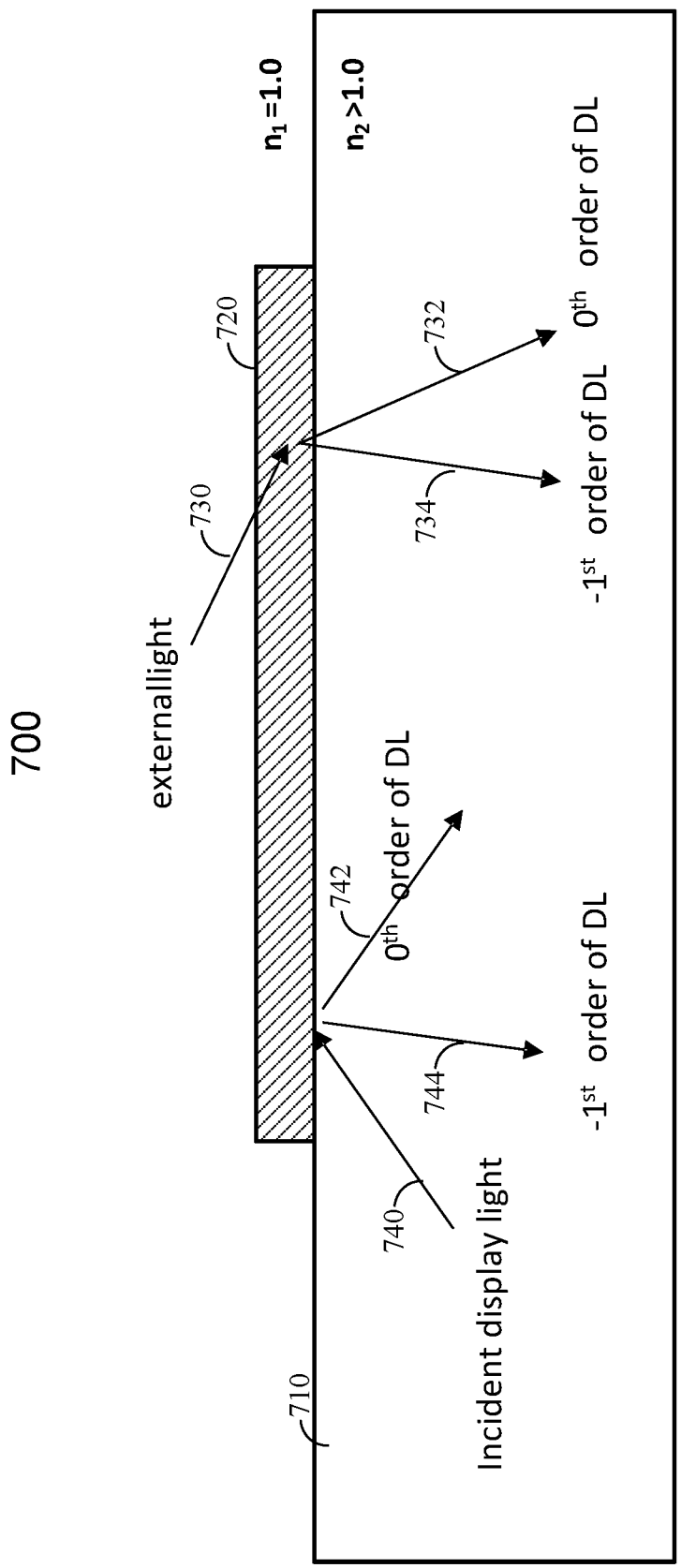
FIG. 7 illustrates propagations of display light and external light in an example waveguide display.

FIG. 7 illustrates propagations of incident display light 740 and external light 730 in an example waveguide display 700 including a waveguide 710 and a grating coupler 720. Waveguide 710 may be a flat or curved transparent substrate with a refractive index $n_2$ greater than the free space refractive index $n_1$ (i.e., 1.0). Grating coupler 720 may include, for example, a Bragg grating or a surface-relief grating.

Incident display light 740 may be coupled into waveguide 710 by, for example, input coupler 630 of FIG. 6 or other couplers (e.g., a prism or slanted surface) described above. Incident display light 740 may propagate within waveguide 710 through, for example, total internal reflection. When incident display light 740 reaches grating coupler 720, incident display light 740 may be diffracted by grating coupler 720 into, for example, a $0^{th}$ order diffraction (i.e., reflection) light 742 and a –1st order diffraction light 744. The $0^{th}$ order diffraction may continue to propagate within waveguide 710, and may be reflected by the bottom surface of waveguide 710 towards grating coupler 720 at a different location. The –1st order diffraction light 744 may be coupled (e.g., refracted) out of waveguide 710 towards the user's eye, because a total internal reflection condition may not be met at the bottom surface of waveguide 710 due to the diffraction angle of the $–1^{st}$ order diffraction light 744.

External light 730 may also be diffracted by grating coupler 720 into, for example, a $0^{th}$ order diffraction light 732 or a –1st order diffraction light 734. The $0^{th}$ order diffraction light 732 or the –1st order diffraction light 734 may be refracted out of waveguide 710 towards the user's eye. Thus, grating coupler 720 may act as an input coupler for coupling external light 730 into waveguide 710, and may also act as an output coupler for coupling incident display light 740 out of waveguide 710. As such, grating coupler 720 may act as a combiner for combining external light 730 and incident display light 740 and send the combined light to the user's eye.

In order to diffract light at a desired direction towards the user's eye and to achieve a desired diffraction efficiency for certain diffraction orders, grating coupler 720 may include a blazed or slanted grating, such as a slanted Bragg grating or surface-relief grating, where the grating ridges and trenches (or grooves) may be tilted relative to the surface normal of grating coupler 720 or waveguide 710.

Figure 8:
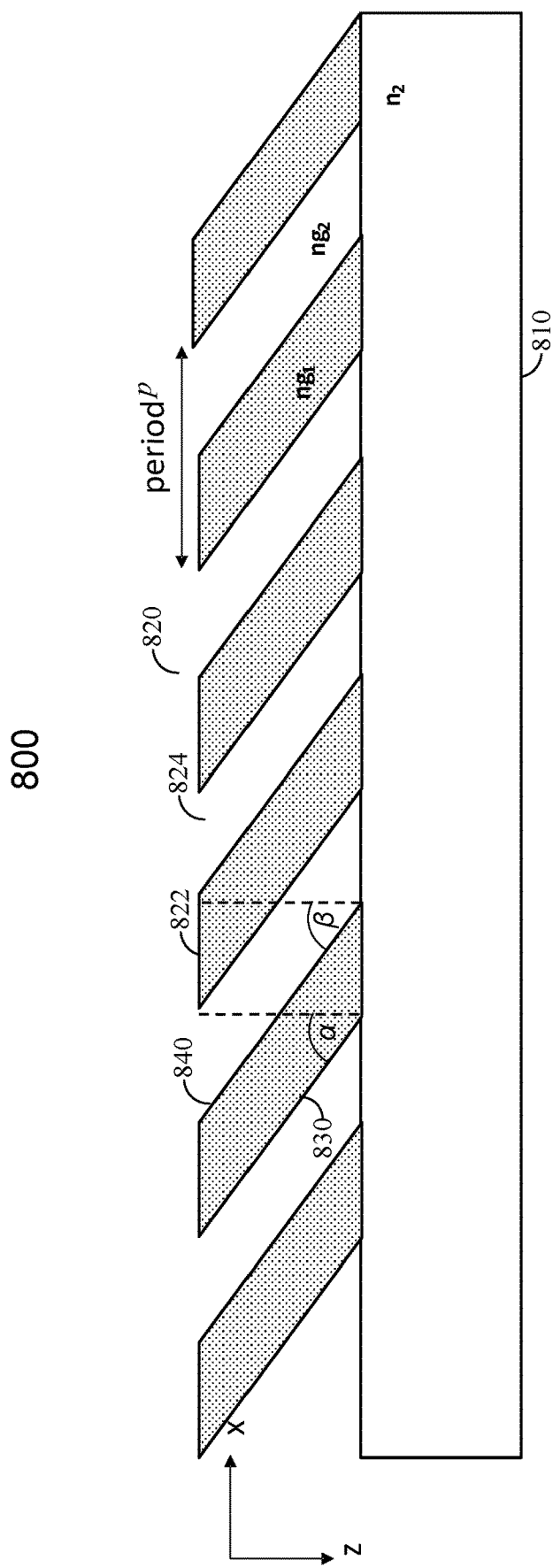
FIG. 8 illustrates an example slanted grating coupler in an example waveguide display according to certain embodiments.

FIG. 8 illustrates an example slanted grating 820 in an example waveguide display 800 according to certain embodiments. Waveguide display 800 may include slanted grating 820 on a waveguide 810, such as substrate 620. Slanted grating 820 may act as a grating coupler for couple light into or out of waveguide 810. In some embodiments, slanted grating 820 may include a periodic structure with a period p. For example, slanted grating 820 may include a plurality of ridges 822 and trenches or grooves 824 between ridges 822. Each period of slanted grating 820 may include a ridge 822 and a trench or groove 824, which may be an air gap or a region filled with a material with a refractive index $n_{g2}$. The ratio between the width of a ridge 822 and the grating period p may be referred to as duty cycle. Slanted grating 820 may have a duty cycle ranging, for example, from about 10% to about 90% or greater. In some embodiments, the duty cycle may vary from period to period. In some embodiments, the period p of the slanted grating may vary from one area to another on slanted grating 820, or may vary from one period to another (i.e., chirped) on slanted grating 820.

Ridges 822 may be made of a material with a refractive index of $n_{g1}$, such as silicon containing materials (e.g., $SiO_2$, $Si_3N_4$, SiC, $SiO_xN_y$, or amorphous silicon), organic materials (e.g., spin on carbon (SOC) or amorphous carbon layer (ACL) or diamond like carbon (DLC)), inorganic metal oxide layers (e.g., $TiO_x$, $AlO_x$, $TaO_x$, $HfO_x$, etc.), or a combination thereof. Each ridge 822 may include a leading edge 830 with a slant angle α and a trailing edge 840 with a slant angle β. In some embodiments, leading edge 830 and training edge 840 of each ridge 822 may be parallel to each other. In other words, slant angle α is approximately equal to slant angle β. In some embodiments, slant angle α may be different from slant angle β. In some embodiments, slant angle α may be approximately equal to slant angle β. For example, the difference between slant angle α and slant angle θ may be less than 20%, 10%, 5%, 1%, or less. In some embodiments, slant angle α and slant angle θ may range from, for example, about 30° or less to about 70° or larger. In some embodiments, the slant angle α and/or slant angle θ may be greater than 30°, 45°, 50°, 70°, or larger.

The slanted grating 820 may be fabricated using many different nanofabrication techniques. The nanofabrication techniques generally include a patterning process and a post-patterning (e.g., overcoating) process. The patterning process may be used to form slanted ridges 822 of the slanted grating 820. There may be many different nanofabrication techniques for forming the slanted ridges 822. For example, in some implementations, the slanted grating 820 may be fabricated using lithography techniques including slanted etching. In some implementations, the slanted grating 820 may be fabricated using nanoimprint lithography (NIL) from a master mold.

The post-patterning process may be used to overcoat the slanted ridges 822 and/or to fill the trenches or grooves 824 between the slanted ridges 822 with a material having a refractive index $n_{g2}$ different from the refractive index $n_{g1}$ of the slanted ridges 822. The post-patterning process may be independent from the patterning process. Thus, a same post-patterning process may be used on slanted gratings fabricated using any pattering technique.

Techniques and processes for fabricating the slanted grating coupler described below are for illustration purposes only and are not intended to be limiting. A person skilled in the art would understand that various modifications may be made to the techniques described below. In some implementations, some operation described below may be omitted. In some implementations, additional operations may be performed to fabricate the grating coupler. For example, in some implementations, the surface of a mold or some other structures may be coated or plated prior to imprinting to reduce wearing of the mold, improve product quality, and reduce manufacturing cost. For example, in some implementations, an anti-sticking layer may be coated on the mold before the molding (or imprinting) process.

Figure 9A:
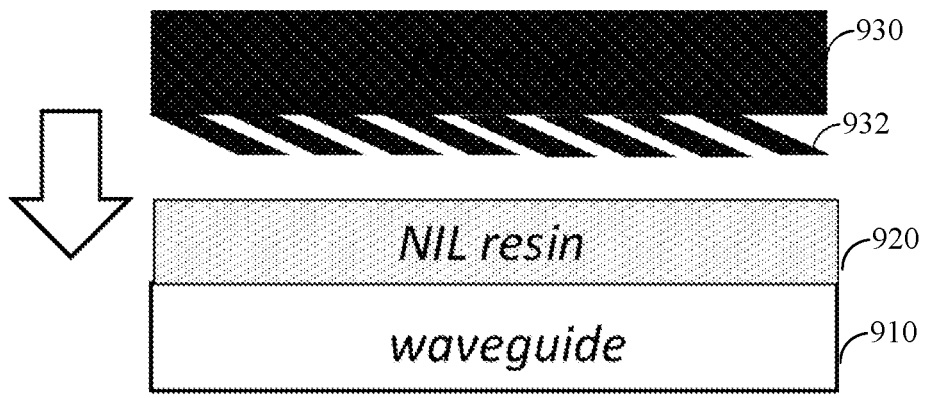
FIGS. 9A and 9B illustrate an example process for fabricating a slanted surface-relief grating by molding according to certain embodiments.
Figure 9B:
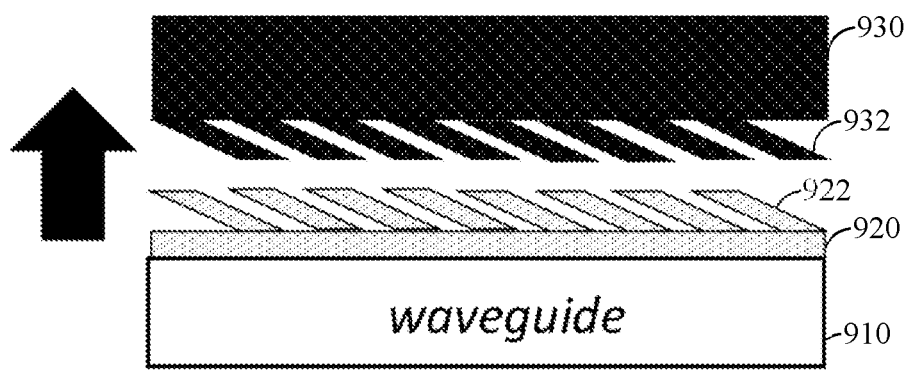

FIGS. 9A and 9B illustrate an example process for fabricating a slanted surface-relief grating by direct molding according to certain embodiments. In FIG. 9A, a waveguide 910 may be coated with a NIL resin layer 920. NIL resin layer 920 may include, for example, a butyl-acrylate-based resin doped with a sol-gel precursor (e.g., titanium butoxide), a monomer containing a reactive functional group for subsequent infusion processes (such as acrylic acid), and/or high refractive index nanoparticles (e.g., $TiO_2$, GaP, $HfO_2$, GaAs, etc.). In some embodiments, NIL resin layer 920 may include polydimethylsiloxane (PDMS) or another silicone elastomer or silicon-based organic polymer. NIL resin layer 920 may be deposited on waveguide 910 by, for example, spin-coating, lamination, or ink injection. A NIL mold 930 with slanted ridges 932 may be pressed against NIL resin layer 920 and waveguide 910 for molding a slanted grating in NIL resin layer 920. NIL resin layer 920 may be cured subsequently (e.g., cross-linked) using heat and/or ultraviolet (UV) light.

FIG. 9B shows the demolding process, during which NIL mold 930 is detached from NIL resin layer 920 and waveguide 910. As shown in FIG. 9B, after NIL mold 930 is detached from NIL resin layer 920 and waveguide 910, a slanted grating 922 that is complementary to slanted ridges 932 in NIL mold 930 may be formed in NIL resin layer 920 on waveguide 910.

In some embodiments, a master NIL mold (e.g., a hard mold including a rigid material, such as Si, $SiO_2$, $Si_3N_4$, or a metal) may be fabricated first using, for example, slanted etching, micromachining, or 3-D printing. A soft stamp may be fabricated using the master NIL mold, and the soft stamp may then be used as the working stamp to fabricate the slanted grating. In such a process, the slanted grating structure in the master NIL mold may be similar to the slanted grating of the grating coupler for the waveguide display, and the slanted grating structure on the soft stamp may be complementary to the slanted grating structure in the master NIL mold and the slanted grating of the grating coupler for the waveguide display. Compared with a hard stamp or hard mold, a soft stamp may offer more flexibility during the molding and demolding processes.

FIGS. 10A-10D illustrate an example process 1000 for fabricating a soft stamp used for making a slanted surface-relief grating according to certain embodiments. FIG. 10A shows a master mold 1010 (e.g., a hard mold or hard stamp). Master mold 1010 may include a rigid material, such as a semiconductor substrate (e.g., Si or GaAs), an oxide (e.g., $SiO_2$, $Si_3N_4$, $TiO_x$, $AlO_x$, $TaO_x$, or $HfO_x$), or a metal plate. Master mold 1010 may be fabricated using, for example, a slanted etching process using reactive ion beams or chemically assisted reactive ion beams, a micromachining process, or a 3-D printing process. As shown in FIG. 10A, master mold 1010 may include a slanted grating 1020 that may in turn include a plurality of slanted ridges 1022 with gaps 1024 between slanted ridges 1022.

FIG. 10B illustrates master mold 1010 coated with a soft stamp material layer 1030. Soft stamp material layer 1030 may include, for example, a resin material or a curable polymer material. In some embodiments, soft stamp material layer 1030 may include polydimethylsiloxane (PDMS) or another silicone elastomer or silicon-based organic polymer. In some embodiment, soft stamp material layer 1030 may include ethylene tetrafluoroethylene (ETFE), perfluoropolyether (PFPE), or other fluorinated polymer materials. In some embodiments, soft stamp material layer 1030 may be coated on master mold 1010 by, for example, spin-coating or ink injection.

FIG. 10C illustrates a lamination process for laminating a soft stamp foil 1040 onto soft stamp material layer 1030. A roller 1050 may be used to press soft stamp foil 1040 against soft stamp material layer 1030. The lamination process may also be a planarization process to make the thickness of soft stamp material layer 1030 substantially uniform. After the lamination process, soft stamp foil 1040 may be tightly or securely attached to soft stamp material layer 1030.

FIG. 10D illustrates a delamination process, where a soft stamp including soft stamp foil 1040 and attached soft stamp material layer 1030 is detached from master mold 1010. Soft stamp material layer 1030 may include a slanted grating structure that is complementary to the slanted grating structure on master mold 1010. Because the flexibility of soft stamp foil 1040 and attached soft stamp material layer 1030, the delamination process may be relatively easy compared with a demolding process using a hard stamp or mold. In some embodiments, a roller (e.g., roller 1050) may be used in the delamination process to ensure a constant or controlled delamination speed. In some embodiments, roller 1050 may not be used during the delamination. In some implementations, an anti-sticking layer may be formed on master mold 1010 before soft stamp material layer 1030 is coated on master mold 1010. The anti-sticking layer may also facilitate the delamination process. After the delamination of the soft stamp from master mold 1010, the soft stamp may be used to mold the slanted grating on a waveguide of a waveguide display.

FIGS. 11A-11D illustrate an example process 1100 for fabricating a slanted surface-relief grating using a soft stamp according to certain embodiments. FIG. 11A shows a waveguide 1110 coated with an imprint resin layer 1120. Imprint resin layer 1120 may include, for example, a butyl-acrylate based resin doped with a sol-gel precursor (e.g., titanium butoxide), a monomer containing a reactive functional group for subsequent infusion processes (such as acrylic acid), and/or high refractive index nanoparticles (e.g., $TiO_2$, GaP, $HfO_2$, GaAs, etc.). In some embodiments, imprint resin layer 1120 may include polydimethylsiloxane (PDMS) or another silicone elastomer or silicon-based organic polymer. In some embodiments, imprint resin layer 1120 may include ethylene tetrafluoroethylene (ETFE), perfluoropolyether (PFPE), or other fluorinated polymer materials. Imprint resin layer 1120 may be deposited on waveguide 1110 by, for example, spin-coating, lamination, or ink injection. A soft stamp 1130 including slanted ridges 1132 attached to a soft stamp foil 1140 may be used for the imprint.

FIG. 11B shows the lamination of soft stamp 1130 onto imprint resin layer 1120. Soft stamp 1130 may be pressed against imprint resin layer 1120 and waveguide 1110 using a roller 1150, such that slanted ridges 1132 may be pressed into imprint resin layer 1120. Imprint resin layer 1120 may be cured subsequently. For example, imprint resin layer 1120 may be cross-linked using heat and/or ultraviolet (UV) light.

FIG. 11C shows the delamination of soft stamp 1130 from imprint resin layer 1120. The delamination may be performed by lifting soft stamp foil 1140 to detach slanted ridges 1132 of soft stamp 1130 from imprint resin layer 1120. Imprint resin layer 1120 may now include a slanted grating 1122, which may be used as the grating coupler or may be over-coated to form the grating coupler for the waveguide display. As described above, because of the flexibility of soft stamp 1130, the delamination process may be relatively easy compared with a demolding process using a hard stamp or mold. In some embodiments, a roller (e.g., roller 1150) may be used in the delamination process to ensure a constant or controlled delamination speed. In some embodiments, roller 1150 may not be used during the delamination.

FIG. 11D shows an example imprinted slanted grating 1122 formed on waveguide 1110 using soft stamp 1130. As described above, slanted grating 1122 may include ridges and gaps between the ridges and thus may be over-coated with a material having a refractive index different from imprint resin layer 1120 to fill the gaps and form the grating coupler for the waveguide display.

In various embodiments, the period of the slanted grating may vary from one area to another on slanted grating 1122, or may vary from one period to another (i.e., chirped) on slanted grating 1122. Slanted grating 1122 may have a duty cycle ranging, for example, from about 10% to about 90% or greater. In some embodiments, the duty cycle may vary from period to period. In some embodiments, the depth or height of the ridges of slanted grating 1122 may be greater than 50 nm, 100 nm, 200 nm, 300 nm, 400 nm, or higher. The slant angles of the leading edges of the ridges of slanted grating 1122 and the slant angles of the trailing edges of the ridges of slanted grating 1122 may be greater than 30°, 45°, 60°, or higher. In some embodiments, the leading edge and training edge of each ridge of slanted grating 1122 may be parallel to each other. In some embodiments, the difference between the slant angle of the leading edge of a ridge of slanted grating 1122 and the slant angle of the trailing edge of the ridge of slanted grating 1122 may be less than 20%, 10%, 5%, 1%, or less.

Figure 12:
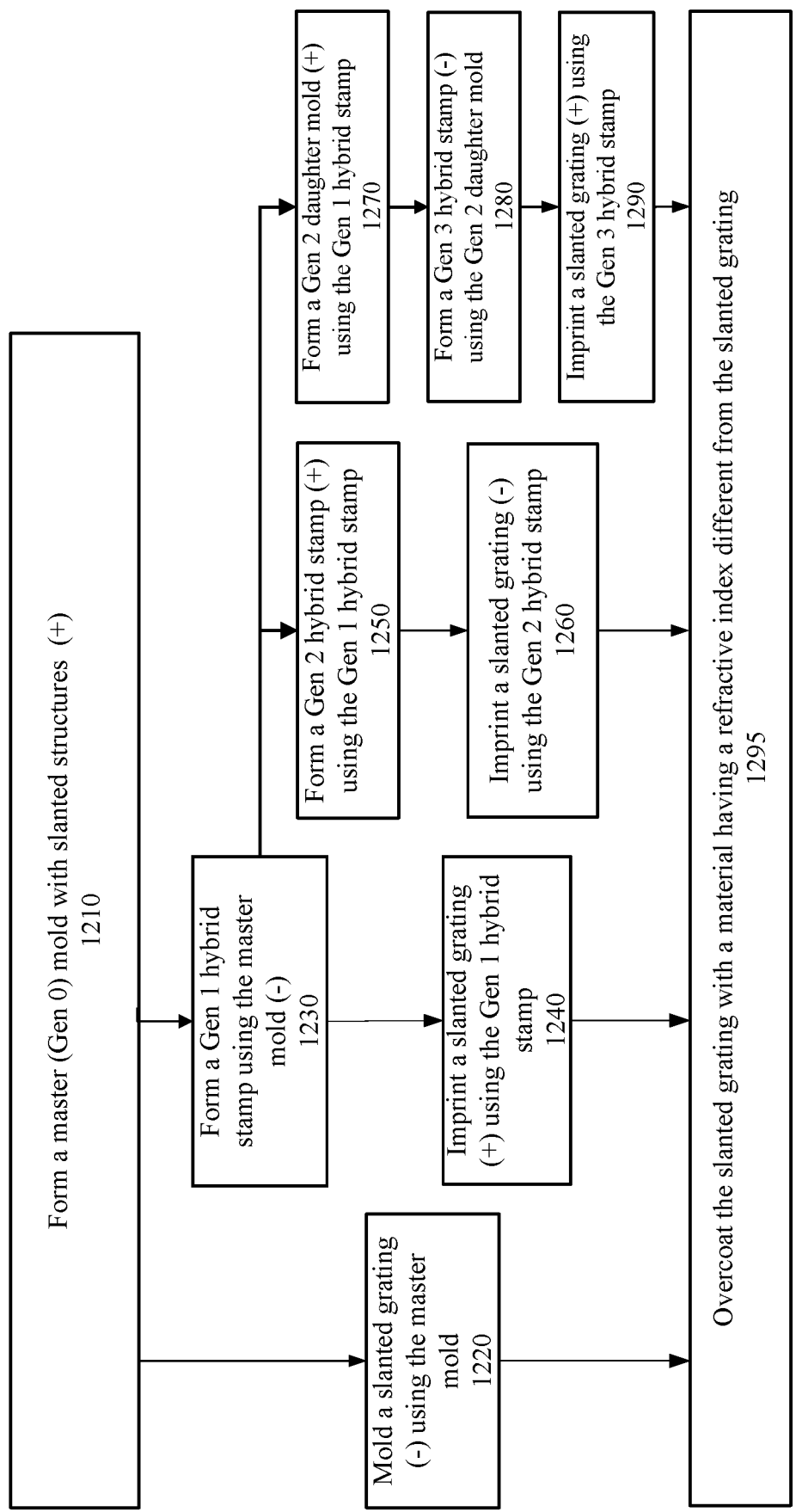
FIG. 12 is a simplified flow chart illustrating an example method of fabricating a slanted surface-relief grating using nanoimprint lithography according to certain embodiments.

FIG. 12 is a simplified flow chart 1200 illustrating example methods of fabricating a slanted surface-relief grating using nanoimprint lithography according to certain embodiments. As described above, different generations of NIL stamps may be made and used as the working stamp to mold the slanted gratings. For example, in some embodiments, a master mold (i.e., generation 0 mold, which may be a hard mold) may be used as the working stamp to mold the slanted grating directly. In some embodiments, a hybrid stamp (e.g., a generation 1 hybrid mold or stamp) may be fabricated using the master mold and may be used as the working stamp for nanoimprinting. In some embodiments, a generation 2 hybrid mold (or stamp) may be made from the generation 1 mold, and may be used as the working stamp for the nanoimprinting. In some embodiments, a generation 3 mold, a generation 4 mold, and so on, may be made and used as the working stamp.

At block 1210, a master mold with a slanted structure may be fabricated using, for example, a slanted etching process that uses reactive ion beams or chemically-assisted reactive ion beams, a micromachining process, or a 3-D printing process. The master mold may be referred to as the generation 0 (or Gen 0) mold. The master mold may include quartz, fused silica, silicon, other metal-oxides, or plastic compounds. The slanted structure of the master mold may be referred to as having a positive (+) tone. The master mold may be used as a working stamp for molding the slanted grating directly (i.e., hard NIL) at block 1220. As described above, when the master mold is used as the working stamp, the slanted structure of the master mold may be complementary to the desired slanted grating. Alternatively, the master mold may be used to make a hybrid stamp as the working stamp for molding the slanted grating. The slanted structure of the hybrid stamp may be similar to the desired slanted grating or may be complementary to the desired slanted grating, depending on the generation of the hybrid stamp.

At block 1220, a slanted grating may be molded in, for example, a resin layer using the master mold as described above with respect to, for example, FIGS. 9A and 9B. The resin layer may be coated on a waveguide substrate, and may include, for example, a butyl-acrylate based resin doped with a resin comprising a sol-gel precursor (e.g., titanium butoxide), a monomer containing a reactive functional group for subsequent infusion processes (such as acrylic acid), and/or high refractive index nanoparticles (e.g., $TiO_2$, GaP, $HfO_2$, GaAs, etc.). The master mold may be pressed against the resin layer. The resin layer may then be cured to fix the structure formed within the resin layer by the master mold. The master mold may be detached from the resin layer to form a slanted grating within the resin layer. The slanted grating within the resin layer may have a negative (−) tone compared with the slanted structure of the master mold.

Alternatively, at block 1230, a hybrid stamp (e.g., a hard stamp, a soft stamp, or a hard-soft stamp) with a slanted structure may be fabricated using the master mold as described above with respect to, for example, FIGS. 10A-10D or the process described with respect to, for example, FIGS. 11A-11D. For example, the process of fabricating the hybrid stamp may include coating the master mold with a soft stamp material, such as a resin material described above. A soft stamp foil may then be laminated on the soft stamp material, for example, using a roller. The soft stamp foil and the attached soft stamp material may be securely attached to each other and may be detached from the master mold to form the soft stamp. The hybrid stamp fabricated at block 1230 may be referred to as a generation 1 (or Gen 1) stamp. The slanted grating within the Gen 1 stamp may have a negative (−) tone compared with the slanted structure of the master mold.

At block 1240, a slanted surface-relief grating may be imprinted using the Gen 1 stamp as described above with respect to, for example, FIGS. 11A-11D. For example, a waveguide substrate may be coated with an imprint resin layer. The Gen 1 stamp may be laminated on the imprint resin layer using, for example, a roller. After the imprint resin layer is cured, the Gen 1 stamp may be delaminated from the imprint resin layer to form a slanted grating within the imprint resin layer. The slanted grating within the imprint resin layer may have a positive tone.

Alternatively, in some embodiments, at block 1250, a second generation hybrid stamp (Gen 2 stamp) may be fabricated using the Gen 1 stamp using a process similar to the process for fabricating the Gen 1 stamp as described above with respect to, for example, FIGS. 7A-8D. The slanted structure within the Gen 2 stamp may have a positive tone.

At block 1260, a slanted surface-relief grating may be imprinted using the Gen 2 stamp as described above with respect to, for example, FIGS. 11A-11D. For example, a waveguide substrate may be coated with an imprint resin layer. The Gen 2 stamp may be laminated on the imprint resin layer using, for example, a roller. After the imprint resin layer is cured, the Gen 2 stamp may be delaminated from the imprint resin layer to form a slanted grating within the imprint resin layer. The slanted grating within the imprint resin layer may have a negative tone.

Alternatively, in some embodiments, at block 1270, a second generation (Gen 2) daughter mold may be fabricated using the Gen 1 stamp using a process similar to the process for fabricating the Gen 1 stamp as described above with respect to, for example, FIGS. 10A-11D. The slanted structure within the Gen 2 daughter mold may have a positive tone.

At block 1280, a third generation hybrid stamp (Gen 3 stamp) may be fabricated using the Gen 2 daughter mold using a process similar to the process for fabricating the Gen 1 stamp or the Gen 2 daughter mold as described above with respect to, for example, FIGS. 10A-11D. The slanted structure within the Gen 3 stamp may have a negative tone.

At block 1290, a slanted surface-relief grating may be imprinted using the Gen 3 stamp as described above with respect to, for example, FIGS. 11A-11D. For example, a waveguide substrate may be coated with an imprint resin layer. The Gen 3 stamp may be laminated on the imprint resin layer using, for example, a roller. After the imprint resin layer is cured, the Gen 3 stamp may be delaminated from the imprint resin layer to form a slanted grating within the imprint resin layer. The slanted grating within the imprint resin layer may have a positive tone.

Even though not shown in FIG. 12, in some embodiments, a fourth generation hybrid stamp, a fifth generation hybrid stamp, and so on, may be fabricated using a similar process, and may be used as the working stamp for imprinting the slanted grating.

Optionally, at block 1295, the slanted grating may be over-coated with a material having a refractive index different from the slanted grating (e.g., the imprint resin layer). For example, in some embodiments, a high refractive index material, such as Hafnia, Titania, Tungsten oxide, Zirconium oxide, Gallium sulfide, Gallium nitride, Gallium phosphide, silicon, or a high refractive index polymer, may be used to over-coat the slanted grating and fill the gaps between the slanted grating ridges. In some embodiments, a low refractive index material, such as silicon oxide, magnesium fluoride, porous silica, or fluorinated low index monomer (or polymer), and the like, may be used to over-coat the slanted grating and fill the gaps between the slanted grating ridges.

One challenge associated with fabrication of nano-structures using nanoimprint techniques, such as fabrication of slanted gratings having a wide range of duty cycles, small periods, high aspect ratios, and/or small feature size (or critical dimension), is to avoid breaking the grating ridges of the soft stamp and/or the imprinted slanted structures during delamination (or demolding). For example, when the slanted structure to be molded has a large slant angle (e.g., greater than 30°, 45°, or 60°), a high depth (e.g., >100 nm), a high aspect ratio (e.g., 3:1, 5:1, 10:1, or larger), and/or a large or small duty cycle (e.g., below 30% or greater than 70%), either the slanted structure in the soft stamp or the slanted structure in the imprint resin layer may experience large stress during the delamination of the soft stamp. The stress may be caused by the deformation (bending) of the slanted structure and/or the surface adhesion or friction between the soft stamp and the resin layer. The surface friction or adhesion may be caused by, for example, Van der Waals forces, mechanical interlock forces, chemical bonding forces, etc. In some cases, the stress may be large enough to cause damages in the slanted structure, including breaking some ridges in the soft stamp and/or the imprinted nano-structure.

Figure 13A:
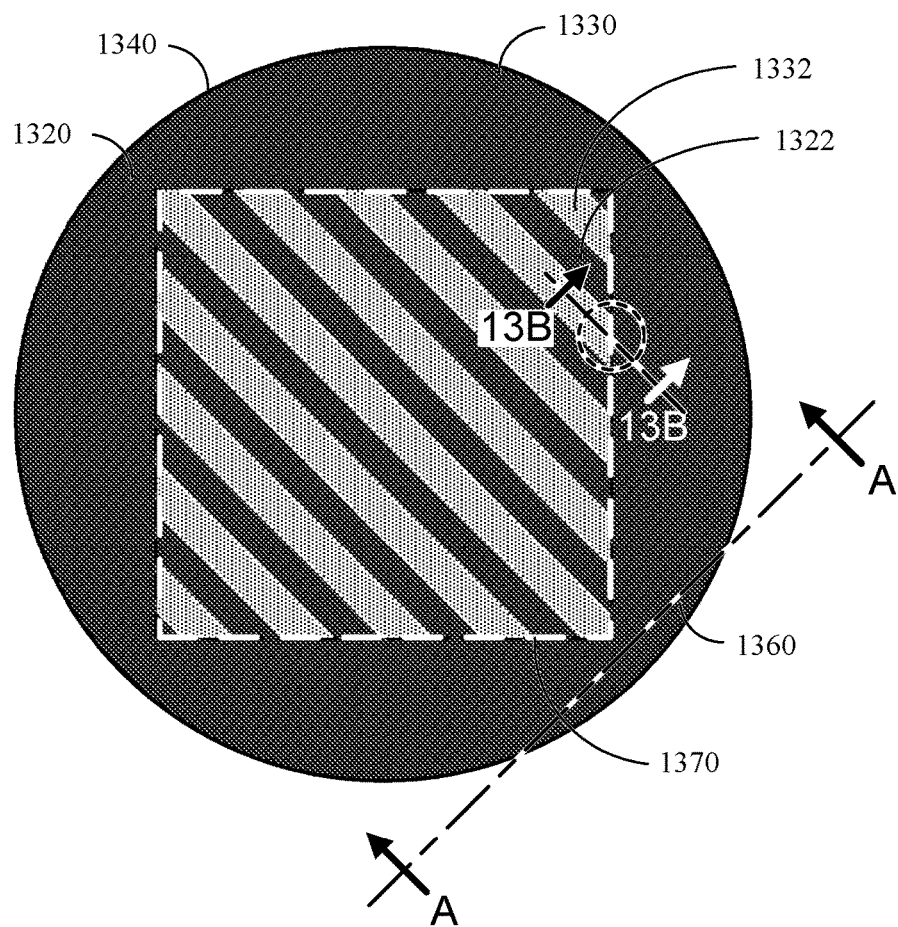
FIG. 13A is a top view of an example soft stamp that has been laminated onto an imprint resin layer.

FIG. 13A is a top view of an example soft stamp 1330 that has been laminated onto an imprint resin layer 1320. It should be noted that FIG. 13A is not a true top view as the nano-structures or slanted ridges 1332 of soft stamp 1330 and the nano-structures or a slanted grating 1322 imprinted in imprint resin layer 1320, both of which are below a soft stamp foil 1340 are also shown. For purpose of description, the area of soft stamp 1330 in which slanted ridges 1332 are formed is referred to as a nano-structure area 1370. Although a circular soft stamp 1330 and a rectangular nano-structure area 1370 are illustrated in FIG. 13A, soft stamp 1330, as well as nano-structure area 1370, may be of any shape, depending on the particular application.

Figure 13B:
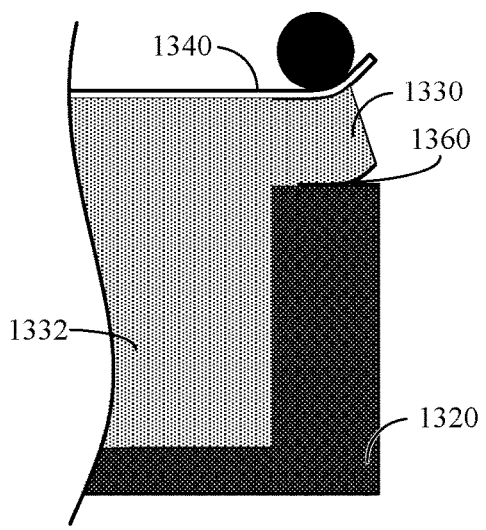
FIG. 13B is a cross-sectional side view taken along line 13B-13B of FIG. 13A, illustrating a portion of the imprint resin layer and the soft stamp of FIG. 13A that has been partially delaminated.
Figure 13C:
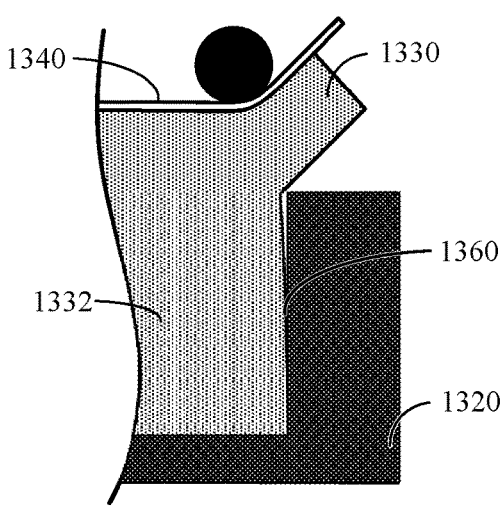
FIG. 13C is a cross-sectional side view similar to FIG. 13B, illustrating a portion of the imprint resin layer and the soft stamp of FIG. 13A that has been further delaminated.

FIG. 13B is a cross-sectional side view taken along line 13B-13B of FIG. 13A, illustrating a portion of imprint resin layer 1320 and soft stamp 1330 that has been partially delaminated. FIG. 13C is a cross-sectional side view similar to FIG. 13B, illustrating a portion of imprint resin layer 1320 and soft stamp 1330 that has been further delaminated. To carry out the delamination or demolding process, soft stamp foil 1340 may be lifted in a manner such that delamination occurs in a direction that is generally along slanted ridges 1332 on soft stamp 1330 (or trenches defined by adjacent slanted ridges 1332) as indicated by the arrows A in FIG. 13A so as to reduce delamination stress. During the delamination or demolding process, a delamination front 1360 (or crack) is created between the interface of soft stamp 1330 and imprint resin layer 1320 and propagates in the direction indicated by the arrows A in FIG. 13A. FIGS. 13B and 13C thus illustrate cross-sectional side views along the delamination propagation direction (or along slanted ridges 1332 on soft stamp 1330).

As shown in FIGS. 13A and 13B, at the beginning of delamination, delamination front 1360 may uniformly propagate at a flat interface between soft stamp 1330 and imprint resin layer 1320 because there may not be any nano-structures near the edge of soft stamp 1330.

However, as shown in FIG. 13C, as delamination front 1360 reaches the edge of nano-structure area 1370 of soft stamp 1330 and continues to propagate, the stress in slanted ridges 1332 of soft stamp 1330 and slanted grating 1322 in imprint resin layer 1320 may change or increase suddenly as the contact surface area between soft stamp 1330 and imprint resin layer 1320 increases suddenly. The sudden increase in surface area and adhesion causes the delamination front 1360 to undergo a sharp change in velocity, which generates forces that are directly dispersed on the nano-structures. The resulting stress may cause damages to slanted ridges 1332 on soft stamp 1330 and/or slanted grating 1322 formed in imprint resin layer 1320.

In some instances, it may be difficult to reduce or eliminate the stress caused by, e.g., surface adhesion or friction due to Van der Waals forces, mechanical interlock forces, chemical bonding forces, etc. However, the change or increase in the stress when delamination front reaches the slanted ridges of a soft stamp may be controlled by modifying the structural profile of the slanted ridges of the soft stamp. For example, the sudden increase in the stress may be limited or reduced by having a gradual change in the height of the slanted ridges (or the depth of the trenches) of the soft stamp near the edges of the nano-structure area (e.g., nano-structure area 1370) of the soft stamp as discussed below.

Figure 14A:
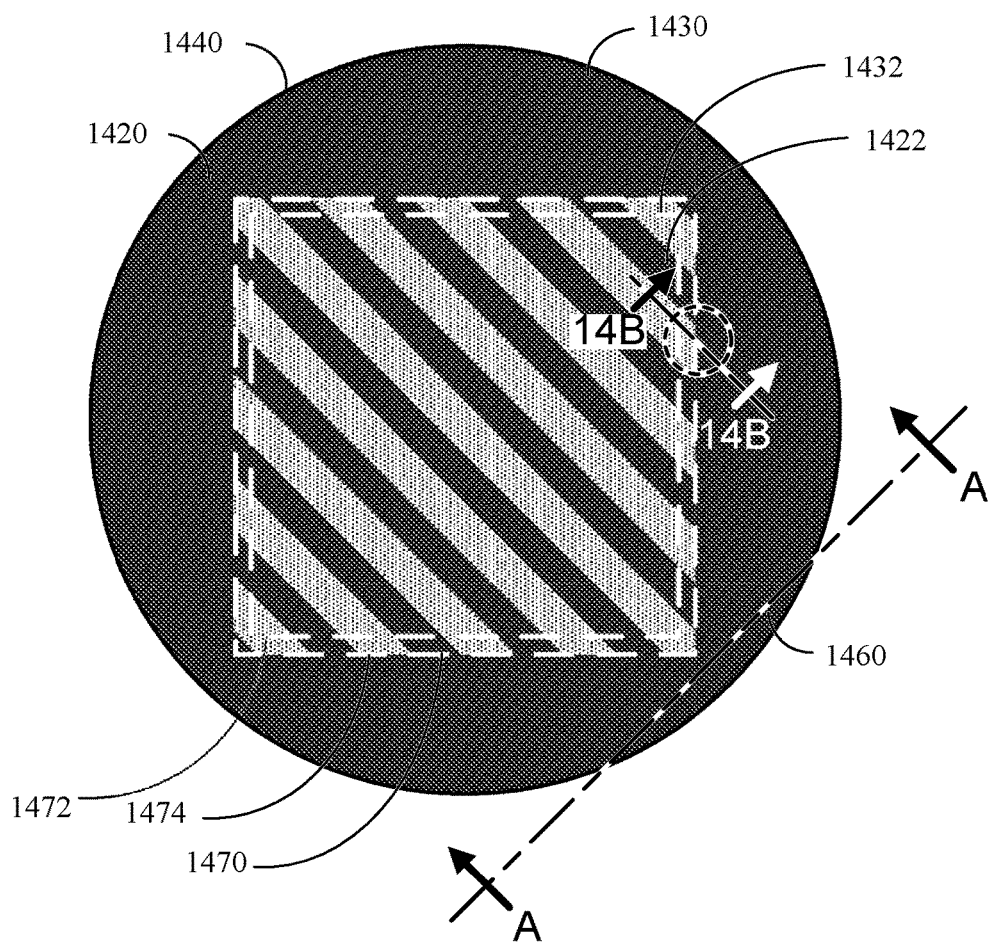
FIG. 14A is a top view of another example soft stamp that has been laminated onto an imprint resin layer according to certain embodiments.

FIG. 14A is a top view of another example soft stamp 1430 that has been laminated onto an imprint resin layer 1420. FIG. 14A is not a true top view as the nano-structures or slanted ridges 1432 of soft stamp 1430 and the nano-structures or a slanted grating 1422 imprinted in imprint resin layer 1420, both of which are below a soft stamp foil 1440, are also shown. Soft stamp 1430 includes a nano-structure area 1470 in which slanted ridges 1432 are formed. Although a circular soft stamp 1430 and a rectangular nano-structure area 1470 are illustrated in FIG. 14A, soft stamp 1430, as well as nano-structure area 1470, may be of any shape, depending on the particular application.

Soft stamp 1430 shown in FIG. 14A differs from soft stamp 1330 shown in FIG. 13A in that the height of slanted ridges 1432 (or the depth of the trenches each defined by two adjacent slanted ridges 1432) of soft stamp 1430 near the edges of nano-structure area 1470 is relatively small so as to reduce the surface area between slanted ridges 1432 and slanted grating 1422 near the edges of nano-structure area 1470, thereby avoiding the sudden change in the stress that slanted ridges 1432 and slanted grating 1422 may experience when a delamination front 1460 approaches the edges of nano-structure area 1470. The height of slanted ridges 1432 (or depth of trenches) may then be gradually increased to a desired height (or depth) to imprint a grating having desired operational ridge height(s) (or trench depth(s)) according to various device performance considerations. Consequently, nano-structure area 1470 may include an inner or operational area 1472 having ridge heights (or trench depths) based on device performance considerations, and may further include an outer or transition area 1474 surrounding operational area 1472 and having a varying ridge height (or trench depth) based on the delamination considerations.

Figure 14B:
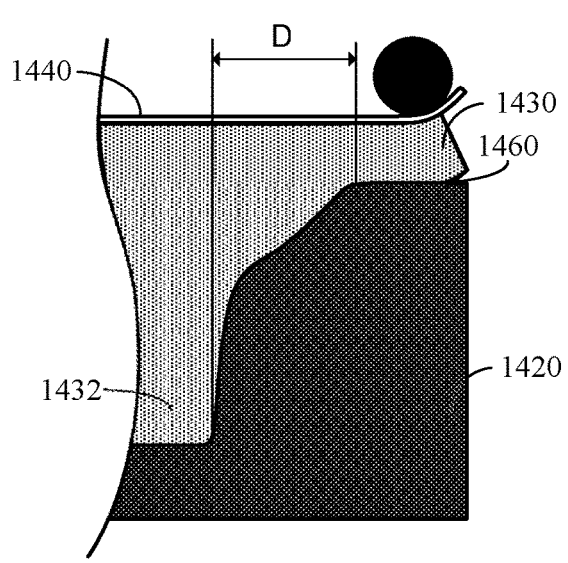
FIG. 14B is a cross-sectional side view taken along line 14B-14B of FIG. 14A, illustrating a portion of the imprint resin layer and the soft stamp of FIG. 14A that has been partially delaminated according to certain embodiments.
Figure 14C:
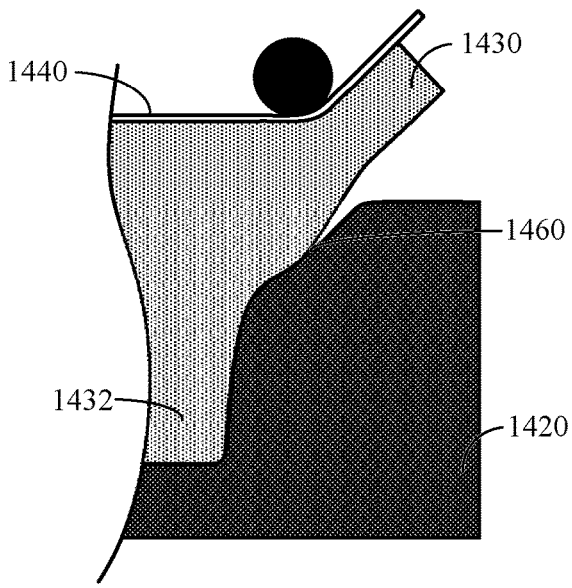
FIG. 14C is a cross-sectional side view similar to FIG. 14B, illustrating a portion of the imprint resin layer and the soft stamp of FIG. 14A that has been further delaminated according to certain embodiments.

FIG. 14B is a cross-sectional side view taken along line 14B-14B of FIG. 14A, illustrating a portion of imprint resin layer 1420 and soft stamp 1430 that has been partially delaminated. FIG. 14C is a cross-sectional side view similar to FIG. 14B, illustrating a portion of imprint resin layer 1420 and soft stamp 1430 that has been further delaminated. As shown in FIGS. 14B and 14C, soft stamp 1430 includes a varying ridge height (or trench depth) near the edges of nano-structure area 1470 (shown in FIG. 14A). The distance or width D shown in FIG. 14B represents a width of transition area 1474 (shown in FIG. 14A) within which the height of slanted ridges 1432 gradually increases to a desired height (or the depth of the trenches gradually increases to a desired depth) as required per device performance requirements. Depending on the application, in various embodiments, the distance D or the width of transition area 1474 may be defined as the distance within which the height of slanted ridges 1432 (or the depth of trenches) gradually increases to at least 70%, at least 80%, at least 90%, at least 95%, or 100% of a maximum ridge height (or maximum trench depth) of soft stamp 1430. The maximum ridge height (or maximum trench depth) may be a maximum ridge height (or maximum trench depth) determined by the device performance requirements. Depending on the application, the maximum ridge height (or maximum trench depth) may be at least 50 nm, at least 100 nm, at least 200 nm, or at least 300 nm, or at least 400 nm.

Because the change or increase in the ridge height (or trench depth) is gradual near the edges of soft stamp 1430, the change or increase in the surface area, as well as the change or increase in surface adhesion, etc., between slanted ridges 1432 and slanted grating 1422 is gradual. Thus, as delamination front 1460 approaches the edges of nano-structure area 1470, the derivative of the velocity changes smoothly, which results in minimum stress dispersed on the nano-structures. The gradual change reduces or avoids damage to slanted ridges 1432 of soft stamp 1430 and slanted grating 1422 in imprint resin layer 1420.

As shown in FIG. 14A, transition area 1474 is formed along the entire periphery of nano-structure area 1470. With such a configuration, when the delamination or demolding process is about to complete and delamination front 1460 reaches the edges of nano-structure area 1470 from the inside of nano-structure area 1470, the ridge height of slanted ridges 1432 gradually decreases. The gradual decrease in the ridge height limits the stress that slanted ridges 1432 of soft stamp 1430 and slanted grating 1422 of imprint resin layer 1420 may experience when the delamination process is about to complete. In some embodiments, transition area 1474 may be formed less than the entire periphery, but only along select portion or portions of the periphery of nano-structure area 1470, depending on the particular application.

Because the variation in ridge height (or trench depth) in the transition area modifies the device design, and such modification may be unnecessary from the device's optical performance perspective. Thus, to minimize the impact to the optical function and to reduce the size of the added footprint, the width of the transition area may be configured as narrow as possible. As discussed above, a soft stamp may be fabricated using a master mold (e.g., a hard mold or hard stamp). To fabricate a soft stamp having a ridge height (or trench depth) of a large variation within a small transition area or short distance, a master mold having a large variation in ridge height (or trench depth) within a small area or short distance is needed. As also discussed above, the master mold may be fabricated using various etching techniques, such as a slanted etching process that uses high energy ions, which may be projected towards the master mold material layer in the form of reactive ion beams or chemically-assisted reactive ion beams, etc. However, it can be challenging to achieve a large variation in etch depth within a small area or short distance, especially when the nano-structures to be fabricated are slanted.

Figure 15A:
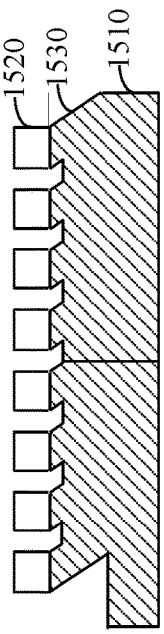
FIGS. 15A and 15B are a side view and a top view, respectively, of a master mold material layer and a master mold mask for fabricating a master mold according to certain embodiments.
Figure 15C:
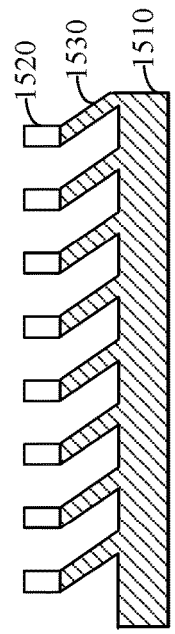
FIGS. 15C, 15D, and 15E are various cross-sectional views of a master mold fabricated using the master mold mask shown in FIGS. 15A and 15B according to certain embodiments. The cross-sectional views shown in FIGS. 15C, 15D, and 15E are taken along line 15C-15C, line 15D-15D, and line 15E-15E of FIG. 15B, respectively.
Figure 15D:
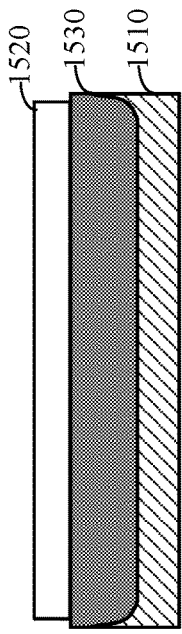
Figure 15E:
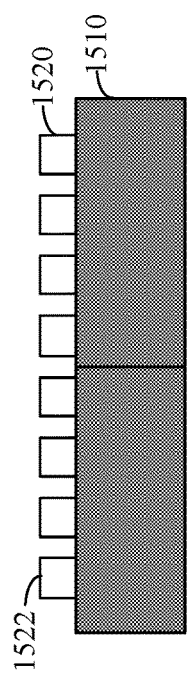
Figure 15B:
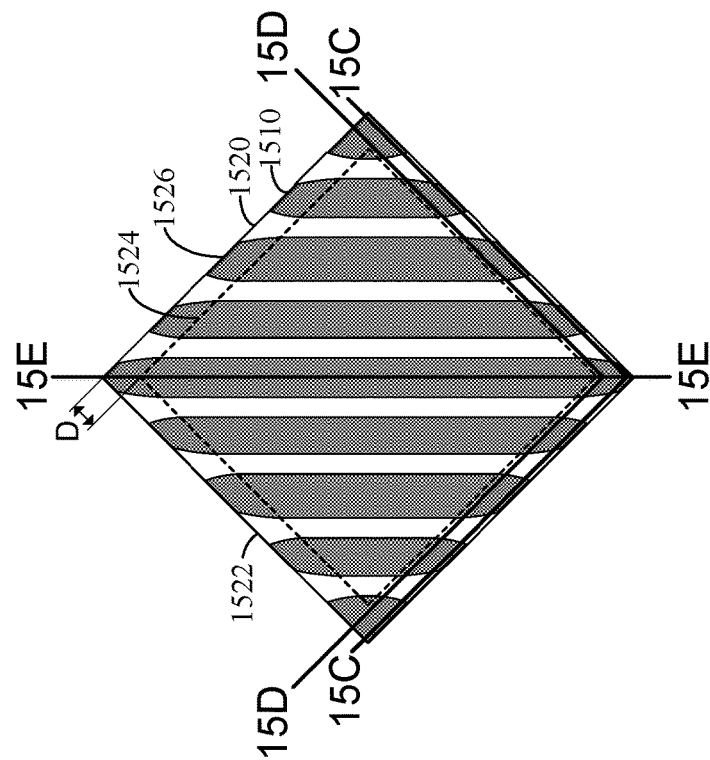

FIGS. 15A and 15B are a side view and a top view, respectively, of a master mold material layer 1510 (or master mold substrate) and a master mold mask 1520 for fabricating a master mold (e.g., a hard mold or hard stamp) that has a large etch depth variation within a very small area or short distance near the edges of nano-structures of the master mold. FIGS. 15A and 15B show that the nano-structures will be fabricated throughout the entire area of master mold material layer 1510, but, in some other embodiments, the nano-structures may be fabricated in only a selected area or areas as shown in FIG. 14A.

Master mold material layer 1510 may include a rigid material, such as a semiconductor substrate (e.g., Si or GaAs), an oxide (e.g., $SiO_2$, $Si_3N_4$, $TiO_x$, $AlO_x$, $TaO_x$, or $HfO_x$), or a metal plate. Master mold mask 1520 may be fabricated from a lithography material layer, such as a photoresist layer. The lithography material layer may be formed on master mold material layer 1510 by deposition, such as spin coating, physical/chemical vapor deposition, or other deposition techniques. Master mold mask 1520 may be formed from the lithography material layer using any appropriate lithography process. For example, the lithography process may be performed using an electron beam, focus ion beam, photolithography stepper, nano-imprint tool, etc. In one example, a photomask with a two-dimensional pattern similar to (or complementary to) the pattern shown in FIG. 15B may be used to expose the lithography material layer (e.g., a positive-tone or negative tone photoresist layer) to form master mold mask 1520 on master mold material layer 1510 after the photoresist development. After the lithography process, master mold mask 1520 having a desired pattern is formed in the lithography material layer and can be used as the etch mask for subsequent etching of master mold material layer 1510 to form the master mold. Although FIG. 15A illustrates that the formed features, i.e., ridges 1522, of master mold mask 1520 stand in a substantially upright position on the top surface of master mold material layer 1510, slanted ridges of master mold mask 1520 may be formed in master mold material layer 1510 in some embodiments to reduce shadowing effect and/or extend duty cycle range during etching, etc.

Generally, the pattern of ridges 1522 can be fabricated with high resolution and high accuracy due to the various lithography techniques available for processing the lithography material layer (or the photoresist layer). As will be explained further below, through manipulation of the pattern of ridges 1522 of master mold mask 1520, desired characteristics or pattern of the ridges of the master mold can be achieved, which may be difficult to achieve otherwise.

Figure 16:
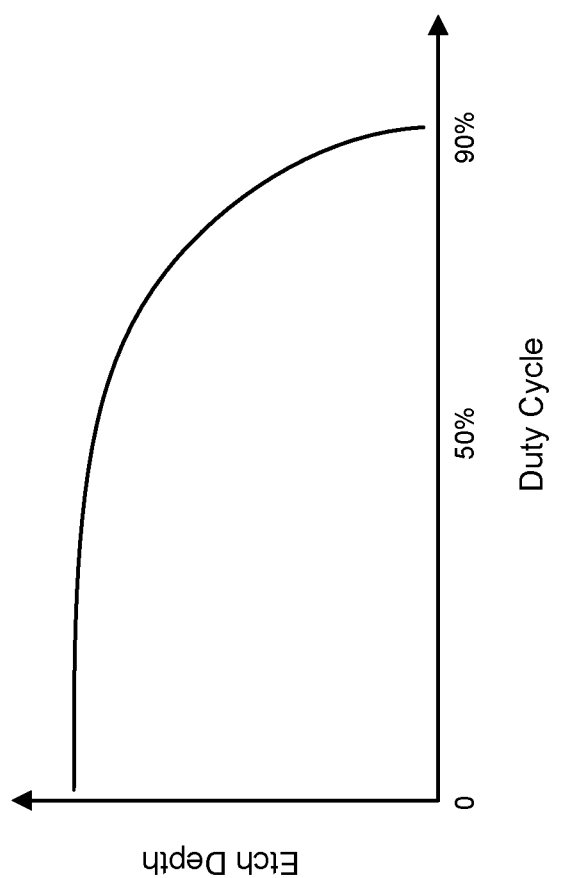
FIG. 16 illustrates an example of a reactive ion etching lag curve that represents the relationship between duty cycles and etch depths.

FIG. 16 illustrates an example of an RIE lag curve, which represents the relationship between duty cycles and etch depths of structures etched using reactive ion etching. Specifically, the horizontal axis represents the duty cycle values, which range from 0% to 100%. As discussed above, for a pattern having ridges and trenches, the duty cycle refers to the ratio between the width of a ridge and the combined width of the ridge and the adjacent trench (i.e., a period). The vertical axis represents the etch depth that can be achieved for each duty cycle using RIE after a same etch duration. It should be noted that the ME lag curve shown in FIG. 16 is for illustration purposes only and may only illustrate a general trend. Depending on the materials to be etched, the etch system used, the etchants used, and/or the etching conditions, the ME lag curve may vary from one etching condition to another etching condition.

As shown in FIG. 16, as the duty cycle increases (i.e., the width of the ridge increases and/or the width of the trench decreases), for a given etch duration, the etch depth that can be achieved by an RIE process gradually decreases. This is because there are abundant ions for the etch reaction to occur regardless of large or small duty cycles, but the ion mean free path is shorter inside small trenches, which lowers the effectiveness of the etch. Also, etch by-products may not be transported outside the etched trenches efficiently when the duty cycle is relatively large. The lag in the by-product transport to the trench opening may result in a lower etch depth when the duty cycle is larger, which may be referred to as the RIE lag effect.

With continued reference to FIG. 16, when the duty cycle changes from, e.g., below about 50% to about 90% or higher, the etch depth can reduce significantly. It should be noted that although FIG. 16 illustrates that when the duty cycle is about 50% or below, the effect of duty cycle on the etch depth may be relatively small in some embodiments, in some other embodiments, the effect of duty cycle on the etch depth may still be significant even when the duty cycle is below 50%, below 40%, or below 30% since the etch depth also depends on the grating pitch or periods. For example, for gratings having a common duty cycle but different grating periods, the grating having the larger period will have a wider trench, which will lead to a deeper etch. Thus, as the grating period changes, the RIE lag curve may start to drop at a duty cycle different from that shown in FIG. 16.

Given this relationship between duty cycle and etch depth, the pattern of master mold mask 1520 near the edge of master mold mask 1520 may be fine-tuned to have a varying duty cycle so as to achieve a varying etch depth near the edge of the master mold to be formed, which in turn can be used to fabricate a soft stamp with a varying ridge height near the edges of the soft stamp. Moreover, because the pattern of master mold mask 1520 can be fined-tuned with high resolution and high accuracy as discussed above, the desired variation in the duty cycle of master mold mask 1520 can be achieved within a very small area or short distance from the edge of master mold mask 1520.

Referring back to FIG. 15B, master mold mask 1520 may include an inner or operational area 1524 and an outer or transition area 1526 along the edges or periphery of master mold mask 1520 and surrounding operational area 1524. Within operational area 1524, the duty cycle of the pattern corresponds to the duty cycle determined by the device performance considerations, which may or may not be a varying duty cycle. Within transition area 1526, the duty cycle may gradually decrease from the edges of master mold mask 1520 towards operational area 1524, or stated differently, the duty cycle may gradually increase towards the edges of master mold mask 1520.

Although only eight ridges 1522 are shown in FIG. 15B for purpose of illustration, master mold mask 1520 may include many more ridges 1522, and may include tens, hundreds, or more of ridges 1522 depending on the application, and ridges 1522 may be formed within close proximity to each other. Thus, the duty cycle at the edge of master mold mask 1520 may be as high as over 50%, over 60%, over 70%, over 80%, over 90%, over 95%, or close to 100%. The duty cycle from the edges of master mold mask 1520 to the edges of operational area 1524 may gradually change from over 90% to below 50%, below 40%, below 30%, below 20%, below 10%, or other desired duty cycle values. Further, as discussed above, the pattern of ridges 1522 can be fine-tubed with high resolution and high accuracy. Thus, the gradual change of the duty cycle from over 90% to below 10% can be achieved within a very short distance D, as shown in FIG. 15B. In some embodiments, the distance D may range from 0.1 to 100 μm.

As discussed above, when the duty cycle changes from a relatively low value, e.g., below 10%, below 30%, or below 50%, to 90% or higher, the etch depth can reduce significantly. Thus, by configuring the pattern in transition area 1526 appropriately, a varying etch depth with a large or great variation can be achieved within a very small area or distance D (e.g., from 0.1 to 100 μm). In some embodiments, the duty cycle of ridges 1522 at the outer edges of transition area 1526 (i.e., the edges of master mold mask 1520) may be as high as 80%, 85%, 90%, 95%, or close to 100%, whereas the duty cycle of ridges 1522 at the inner edges of transition area 1526 (i.e., the edges of operational area 1524) may be lower than 95%, such as below or about 90%, below or about 80%, below or about 70%, below or about 60%, below or about 50%, below or about 40%, below or about 30%, below or about 20%, below or about 10%, or lower.

The transition of the duty cycle from the outer edges of transition area 1526 to the inner edges of transition area 1526 can be gradual or smooth as shown in FIG. 15B, and can be achieved within a distance of 100 μm or less. Thus, when an ion beam etch process is subsequently performed to form the master mold, a varying etch depth can be achieved at the edges of the master mold fabricated. The varying etch depth achieved in turn translates to a varying ridge height (or varying trench depth) near the edges of a soft stamp fabricated from the master mold. A varying grating height near the edges of the imprint resin layer, such as shown in FIGS. 14A-14C, may be obtained using the soft stamp or the master mold directly.

In some embodiments, the etch depth in master mold material layer 1510 proximate the outer edges of transition area 1526 may be as shallow as a few nanometers or tens of nanometers (e.g., below 5 nm, below 10 nm, below 50 nm, below 100 nm, etc.), whereas the etch depth in master mold material layer 1510 proximate the inner edges of transition area 1526 may be as deep as over tens of nanometers or hundreds of nanometers (e.g., over 50 nm, over 100 nm, over 200 nm, over 300 nm, over 400 nm, etc.). Thus, the etch depth may change from a few nanometers to a few hundred of nanometers (e.g., from 5 nm to 400 nm or any other range depending on the application) within a distance of 100 μm or less. A ratio of the etch depth at the outer edge of transition area 1526 to the etch depth at the inner edge of transition area 1526 may range from 100:1 to 2:1, from 90:1 to 2:1, 80:1 to 2:1, 70:1 to 2:1, 60:1 to 2:1, 50:1 to 2:1, 40:1 to 2:1, 30:1 to 2:1, 20:1 to 2:1, 10:1 to 2:1, 8:1 to 2:1, 6:1 to 2:1, 5:1 to 2:1, 4:1 to 2:1, or 3:1 to 2:1. Accordingly, a soft stamp fabricated from the master mold may have a varying ridge height (or varying trench depth) transitioning from a few nanometers to a few hundred of nanometers within a short distance of 100 μm or less. A slanted grating fabricated using such a soft stamp and/or master mold may have a varying grating height only along the edges of the device, which may have a minimal effect on the overall performance of the grating and/or the overall size of the device incorporating such grating. The damage that may be caused by the stress during delamination, however, may be significantly reduced or limited.

FIGS. 15C, 15D, and 15E illustrate cross-sectional views of a master mold 1530 that has been formed in master mold material layer 1510 using, e.g., ME, taken along line 15C-15C, line 15D-15D, and line 15E-15E of FIG. 15B, respectively. Although FIGS. 15C and 15D illustrate slanted ridges which may be formed using a slanted ME process by projecting high energy ions towards master mold material layer 1510 at a slant angle with respect to the top surface of master mold material layer 1510, upright ridges that has a substantially zero slant angle may also be fabricated using the master mold mask 1520 to achieve a large ridge height (or trench depth) variation within a short distance near the edge of master mold material layer 1510.

As shown in FIGS. 15C and 15D, the duty cycle of ridges 1522 of master mold mask 1520 near the outer edge of transition area 1526 is greater than the duty cycle of ridges 1522 of master mold mask 1520 near the inner edge of transition area 1526. Consequently, a less etch depth into master mold material layer 1510 near the outer edge of transition area 1526 as shown in FIG. 15C may be obtained, whereas a greater etch depth into master mold material layer 1510 near the inner edge of transition area 1526 as shown in FIG. 15D may be obtained. Depending on the application, the ridge height (or trench depth) may gradually increase to at least 70%, at least 80%, at least 90%, at least 95%, or 100% of a maximum ridge height (or maximum trench depth) at the inner edge of transition area 1526. In some embodiments, the maximum ridge height (or maximum trench depth) may be a maximum ridge height (or maximum trench depth) determined by the device performance requirements. Depending on the application, the maximum ridge height (or maximum trench depth) may be at least 50 nm, at least 100 nm, at least 200 nm, or at least 300 nm, or at least 400 nm.

FIG. 15E illustrates an example etch profile of one trench etched in master mold material layer 1510. As shown, a great variation in the etch depth is achieved within a short distance from either edge of the master mold 1530 fabricated. Although FIGS. 15B and 15E illustrate a master mold mask 1520 that has a relatively small duty cycle within operational area 1524 as compared to the duty cycle in transition area 1526, which results in a greater etch depth within operational area 1524, it should be noted that operational area 1524 may include a duty cycle that may be greater than, less than, or similar to the duty cycle in transition area 1526. Further, the duty cycle within operational area 1524 may also vary. A master mold with a desired ridge height variation near its edge or periphery can be fabricated independent of the ridge configuration inside and further away from the edge or periphery of the master mold. In other words, the method or technique described herein can be used to fabricate master molds of any configuration that may be determined based on various device performance considerations.

Further, although the fabrication of the master mold is described using RIE as an example fabrication technique, the master mold can be fabricated using various other fabrication techniques, such as micromachining process, 3-D printing process, focus ion beam milling process, sputtering, etc. Regardless of the fabrication processes or techniques employed for fabricating such master mold, as long as the large variation of the ridge height dimension can be effectuated within a short distance or small area near the edge of the master mold, a soft stamp and/or other slanted surface-relief structure may be fabricated using the master mold with limited or minimal damage to the slanted ridges of the soft stamp and/or the slanted surface-relief structure caused by stress during the delamination process.

Figure 17:
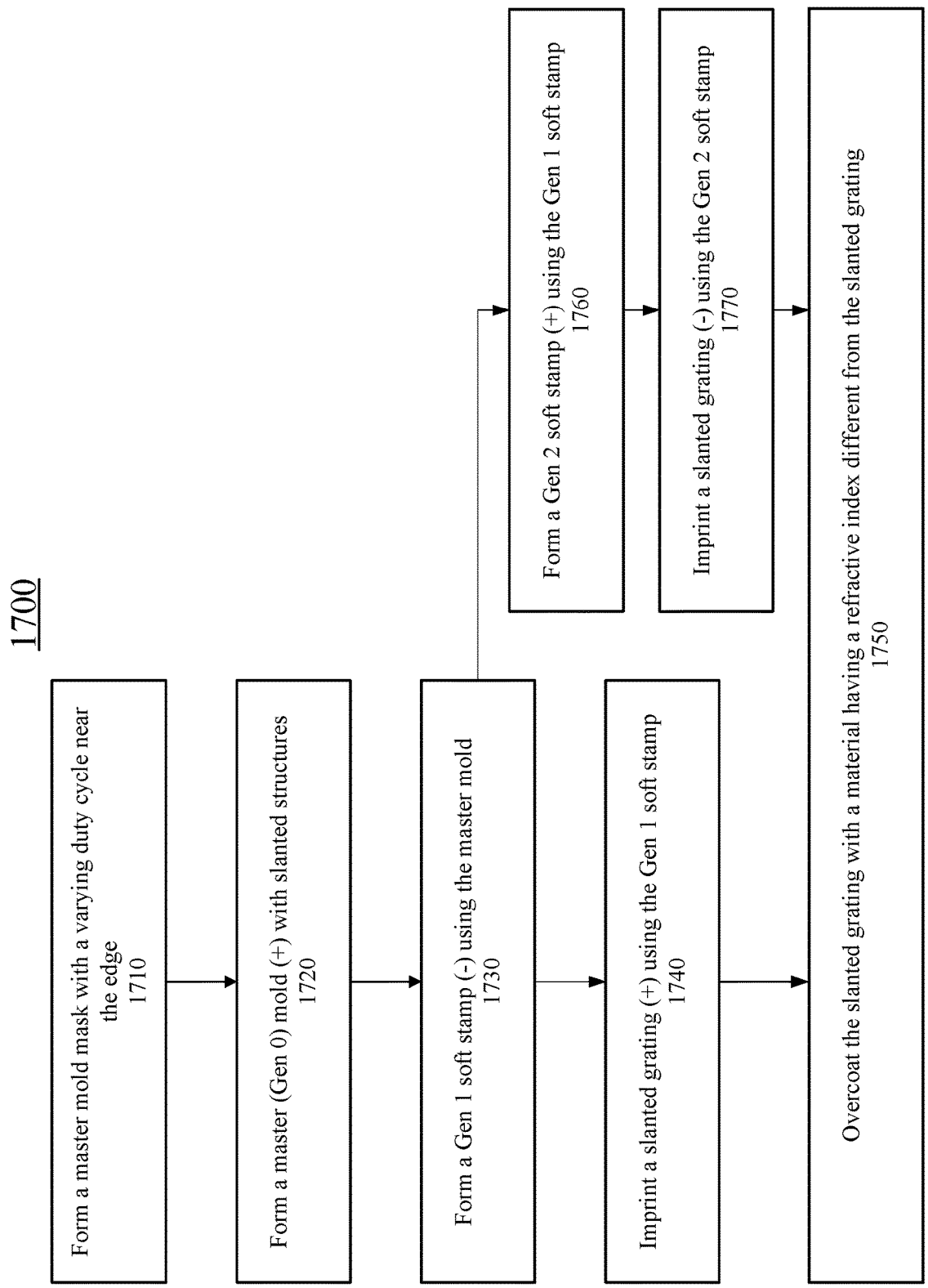
FIG. 17 is a simplified flow chart illustrating an example method of fabricating a slanted surface-relief grating using nanoimprint lithography according to certain embodiments.

FIG. 17 is a simplified flow chart 1700 illustrating an example method of fabricating a slanted surface-relief grating using nanoimprint lithography according to certain embodiments.

At block 1710, a master mold mask is formed on a master mold material layer or master mold substrate. The master mold mask may be formed in a lithography material layer, such as a photoresist layer, which may be deposited on the master mold material layer by spin coating or other deposition techniques. The master mold mask may then be formed from the lithography material layer using an electron beam, focus ion beam, photolithography stepper, nanoimprint tool, or any appropriate lithography process. The master mold mask formed may include a varying duty cycle near the edge of the master mold mask, such as master mold mask 1520 described above with reference to FIGS. 15A-E. The area or distance cross which such duty cycle variation occurs may be very small, such as between 0.1 to 100 μm.

At block 1720, a master mold (which may be a hard mold) with nano-structures, such as slanted ridges, may be fabricated in the master mold material layer using the master mold mask as an etch mask. The master mold may be etched using a slanted ME process that utilizes high energy ions, which may be projected towards the master mold material layer in the form of reactive ion beams, chemically-assisted reactive ion beams, etc., at a slant angle relative to a top surface of the master mold material layer. The master mold material layer may include quartz, fused silica, silicon, other metal-oxides, or plastic compounds.

The master mold fabricated at block 1720 may include a varying ridge height near its edge due to the varying etch depth resulted from the varying duty cycle of the master mold mask. The achieved varying ridge height may gradually increase from the edge of the master mold towards an inner region of the master mold, or stated differently, gradually decrease towards the edge of the master mold. The distance across which such ridge height variation occurs can be very small and may be limited to be below 100 such as 0.1 to 10 Similar to the duty cycle of the master mold mask, the duty cycle of the master mold also changes gradually near its edge. Thus, the duty cycle of the master mold at its edge may be as high as over 70%, over 80%, over 90%, over 95%, or higher, and may be gradually reduced to any desired value depending on the device performance requirement, such as below 90%, below 80%, below 70%, below 60%, below 50%, below 40%, below 30%, below 20%, below 10%, or lower towards the inner region of the master mold. The master mold may be referred to as the generation 0 (or Gen 0) mold. The slanted ridges of the master mold may be referred to as having a positive (+) tone.

At block 1730, a soft stamp with slanted ridges may be fabricated using the master mold fabricated at block 1720. The process of fabricating the soft stamp may include coating the master mold with a soft stamp material, such as a resin imprint material described herein. A soft stamp foil may then be laminated on the soft stamp material, for example, using a roller. The soft stamp foil and the attached soft stamp material may be securely attached to each other and may be detached from the master mold to form the soft stamp.

Because the structures formed in the soft stamp material are complementary to the structures of the master mold, the soft stamp formed at block 1730 also includes a varying ridge height near its edge. The achieved varying ridge height may gradually increase from the edge of the soft stamp towards an inner region of the soft stamp, or stated differently, gradually decrease towards the edge of the soft stamp. The distance across which such ridge height variation occurs can be limited to be below 100 µm, such as 0.1 to 10 µm. The soft stamp fabricated at block 1730 may be referred to as a generation 1 (or Gen 1) stamp.

The slanted ridges of the Gen 1 stamp may have a negative (−) tone compared with the slanted structure of the Gen 0 mold (i.e., the master mold). Thus, instead of having a gradually increasing duty cycle towards the edge as Gen 0 mold does, the duty cycle of the soft stamp gradually decreases towards the edge of the soft stamp. The duty cycle of the soft stamp at its edge may be as low as below 30%, below 20%, below 10%, or even lower, and may be gradually increased to any desired value as required by the device performance, such as above 10%, above 20%, above 30%, above 40%, above 50%, above 60%, above 70%, above 80%, above 90% or even higher towards the inner region of the soft stamp.

At block 1740, a slanted surface-relief grating may be imprinted using the Gen 1 stamp. For example, a waveguide substrate may be coated with an imprint resin layer. The imprint resin layer may include, for example, a butyl-acrylate based resin doped with a sol-gel precursor (e.g., titanium butoxide), a monomer containing a reactive functional group for subsequent infusion processes (such as acrylic acid), and/or high refractive index nanoparticles (e.g., $TiO_2$, GaP, $HfO_2$, GaAs, etc.). In some embodiments, the imprint resin layer may include polydimethylsiloxane (PDMS) or another silicone elastomer or silicon-based organic polymer. In some embodiments, the imprint resin layer may include ethylene tetrafluoroethylene (ETFE), perfluoropolyether (PFPE), or other fluorinated polymer materials. The Gen 1 stamp may be laminated on the imprint resin layer using, for example, a roller, such as shown in FIG. 14A. After the imprint resin layer is cured by UV light and/or heat, the Gen 1 stamp may be delaminated from the imprint resin layer, such as illustrated in FIGS. 14B and 14C, to form a slanted grating within the imprint resin layer.

The slanted grating within the imprint resin layer may have a positive (+) tone and may substantially correspond to the slanted structure of the master mold. Thus, the imprinted grating may include a varying grating depth near its edge that gradually increases from the edge of the slanted grating towards an inner region of the slanted grating, or stated differently, gradually decreases towards the edge of the slanted grating. The imprinted grating may further include a varying duty cycle that gradually decreases from the edge of the slanted grating towards the inner region of the slanted grating, or stated differently, increases towards the edge of the slanted grating. Although the varying grating depth and/or varying duty cycle can be limited to a very small distance within the edge of the slanted grating imprinted, the method illustrated by flow chart 1700 may include an optional operation to trim or remove the edge area that includes the varying grating depth and/or varying duty cycle, if desired.

At block 1750, the slanted grating may be over-coated with a material having a refractive index different from the slanted grating (e.g., the imprint resin layer). For example, in some embodiments, a high refractive index material may be used to over-coat the slanted grating with a relatively low refractive index and fill the gaps between the slanted grating ridges. The high refractive index material may include high refractive index metal or metal compounds, such as Hafnia, Titania, Tungsten oxide, Zirconium oxide, Gallium sulfide, Gallium nitride, Gallium phosphide, etc., silicon, a high refractive index polymer, or a combination of a high refractive index polymer and one or more of the aforementioned high refractive index metal compounds, and the like. In some embodiments, a low refractive index material may be used to over-coat the slanted grating having a relatively high refractive index and fill the gaps between the slanted grating ridges. The low refractive index material may include silicon oxide, magnesium fluoride, porous silica, or fluorinated low index monomer (or polymer), and the like.

Although a soft stamp is described as an example stamp fabricated at block 1730 using the master mold, the master mold may be used to make a hybrid stamp (e.g., a hard stamp, a soft stamp, or a hard-soft stamp). Further, different generations of NIL stamps may be made and used as the working stamp to mold the slanted gratings. For example, in some embodiments, the master mold may be used as the working stamp to mold the slanted grating directly. In some embodiments, in addition to the generation 1 stamp, a generation 2 stamp may be made from the generation 1 stamp as shown at block 1760, and may be used as the working stamp for the nanoimprinting as shown at block 1770. In some embodiments, a generation 3 stamp, a generation 4 stamp, and so on, may be made and used as the working stamp. The varying ridge height may be transferred from the master mold to the generation 1 stamp, to the generation 2 stamp, to the generation 3 stamp, to the generation 4 stamp, and so on, and may be imprinted into the imprint resin layer to reduce stress the imprinting stamp and the imprinted structure may experience during delamination.

Embodiments of the invention may be used to implement components of an artificial reality system or may be implemented in conjunction with an artificial reality system. Artificial reality is a form of reality that has been adjusted in some manner before presentation to a user, which may include, for example, a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 18:
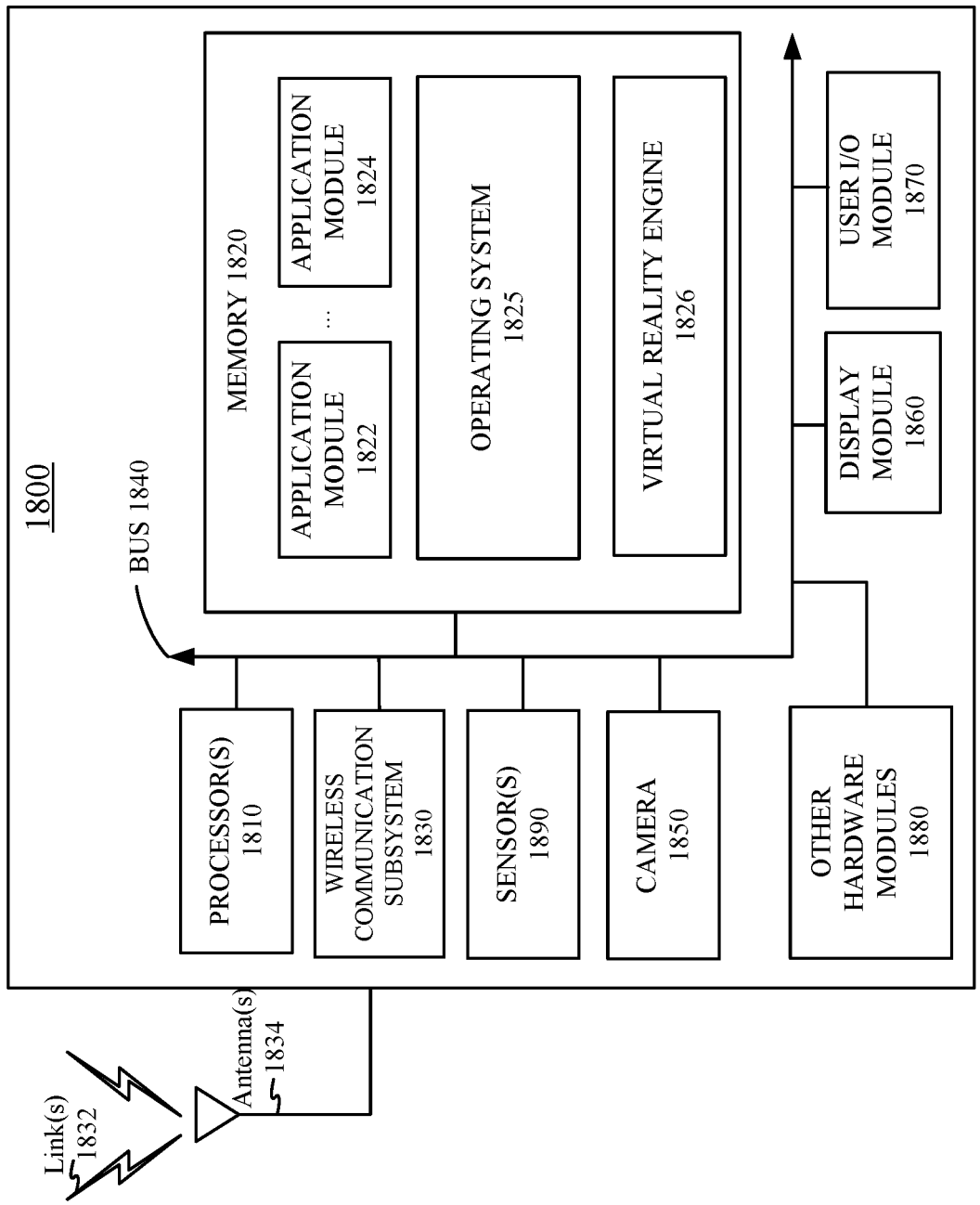
FIG. 18 is a simplified block diagram of an example electronic system of an example near-eye display for implementing some of the examples disclosed herein.

FIG. 18 is a simplified block diagram of an example electronic system 1800 of an example near-eye display (e.g., HMD device) for implementing some of the examples disclosed herein. Electronic system 1800 may be used as the electronic system of an HMD device or other near-eye displays described above. In this example, electronic system 1800 may include one or more processor(s) 1810 and a memory 1820. Processor(s) 1810 may be configured to execute instructions for performing operations at a number of components, and can be, for example, a general-purpose processor or microprocessor suitable for implementation within a portable electronic device. Processor(s) 1810 may be communicatively coupled with a plurality of components within electronic system 1800. To realize this communicative coupling, processor(s) 1810 may communicate with the other illustrated components across a bus 1840. Bus 1840 may be any subsystem adapted to transfer data within electronic system 1800. Bus 1840 may include a plurality of computer buses and additional circuitry to transfer data.

Memory 1820 may be coupled to processor(s) 1810. In some embodiments, memory 1820 may offer both short-term and long-term storage and may be divided into several units. Memory 1820 may be volatile, such as static random access memory (SRAM) and/or dynamic random access memory (DRAM) and/or non-volatile, such as read-only memory (ROM), flash memory, and the like. Furthermore, memory 1820 may include removable storage devices, such as secure digital (SD) cards. Memory 1820 may provide storage of computer-readable instructions, data structures, program modules, and other data for electronic system 1800. In some embodiments, memory 1820 may be distributed into different hardware modules. A set of instructions and/or code might be stored on memory 1820. The instructions might take the form of executable code that may be executable by electronic system 1800, and/or might take the form of source and/or installable code, which, upon compilation and/or installation on electronic system 1800 (e.g., using any of a variety of generally available compilers, installation programs, compression/decompression utilities, etc.), may take the form of executable code.

In some embodiments, memory 1820 may store a plurality of application modules 1822 through 1824, which may include any number of applications. Examples of applications may include gaming applications, conferencing applications, video playback applications, or other suitable applications. The applications may include a depth sensing function or eye tracking function. Application modules 1822-1824 may include particular instructions to be executed by processor(s) 1810. In some embodiments, certain applications or parts of application modules 1822-1824 may be executable by other hardware modules 1880. In certain embodiments, memory 1820 may additionally include secure memory, which may include additional security controls to prevent copying or other unauthorized access to secure information.

In some embodiments, memory 1820 may include an operating system 1825 loaded therein. Operating system 1825 may be operable to initiate the execution of the instructions provided by application modules 1822-1824 and/or manage other hardware modules 1880 as well as interfaces with a wireless communication subsystem 1830 which may include one or more wireless transceivers. Operating system 1825 may be adapted to perform other operations across the components of electronic system 1800 including threading, resource management, data storage control and other similar functionality.

Wireless communication subsystem 1830 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1800 may include one or more antennas 1834 for wireless communication as part of wireless communication subsystem 1830 or as a separate component coupled to any portion of the system. Depending on desired functionality, wireless communication subsystem 1830 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1830 may permit data to be exchanged with a network, other computer systems, and/or any other devices described herein. Wireless communication subsystem 1830 may include a means for transmitting or receiving data, such as identifiers of HMD devices, position data, a geographic map, a heat map, photos, or videos, using antenna(s) 1834 and wireless link(s) 1832. Wireless communication subsystem 1830, processor(s) 1810, and memory 1820 may together comprise at least a part of one or more of a means for performing some functions disclosed herein.

Embodiments of electronic system 1800 may also include one or more sensors 1890. Sensor(s) 1890 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1890 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 1800 may include a display module 1860. Display module 1860 may be a near-eye display, and may graphically present information, such as images, videos, and various instructions, from electronic system 1800 to a user. Such information may be derived from one or more application modules 1822 to 1824, virtual reality engine 1826, one or more other hardware modules 1880, a combination thereof, or any other suitable means for resolving graphical content for the user (e.g., by operating system 1825). Display module 1860 may use liquid crystal display (LCD) technology, light-emitting diode (LED) technology (including, for example, OLED, ILED, mLED, AMOLED, TOLED, etc.), light emitting polymer display (LPD) technology, or some other display technology.

Electronic system 1800 may include a user input/output module 1870. User input/output module 1870 may allow a user to send action requests to electronic system 1800. An action request may be a request to perform a particular action. For example, an action request may be to start or end an application or to perform a particular action within the application. User input/output module 1870 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1800. In some embodiments, user input/output module 1870 may provide haptic feedback to the user in accordance with instructions received from electronic system 1800. For example, the haptic feedback may be provided when an action request is received or has been performed.

Electronic system 1800 may include a camera 1850 that may be used to take photos or videos of a user, for example, for tracking the user's eye position. Camera 1850 may also be used to take photos or videos of the environment, for example, for VR, AR, or MR applications. Camera 1850 may include, for example, a complementary metal-oxide-semiconductor (CMOS) image sensor with a few millions or tens of millions of pixels. In some implementations, camera 1850 may include two or more cameras that may be used to capture 3-D images.

In some embodiments, electronic system 1800 may include a plurality of other hardware modules 1880. Each of other hardware modules 1880 may be a physical device within electronic system 1800. While each of other hardware modules 1880 may be permanently configured as a structure, some of other hardware modules 1880 may be temporarily configured to perform specific functions or temporarily activated. Examples of other hardware modules 1880 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1880 may be implemented in software.

In some embodiments, memory 1820 of electronic system 1800 may also store a virtual reality engine 1826. Virtual reality engine 1826 may execute applications within electronic system 1800 and receive position information, acceleration information, velocity information, predicted future positions, or some combination thereof of the HMD device from the various sensors. In some embodiments, the information received by virtual reality engine 1826 may be used for producing a signal (e.g., display instructions) to display module 1860. For example, if the received information indicates that the user has looked to the left, virtual reality engine 1826 may generate content for the HMD device that mirrors the user's movement in a virtual environment. Additionally, virtual reality engine 1826 may perform an action within an application in response to an action request received from user input/output module 1870 and provide feedback to the user. The provided feedback may be visual, audible, or haptic feedback. In some implementations, processor(s) 1810 may include one or more GPUs that may execute virtual reality engine 1826.

In various implementations, the above-described hardware and modules may be implemented on a single device or on multiple devices that can communicate with one another using wired or wireless connections. For example, in some implementations, some components or modules, such as GPUs, virtual reality engine 1826, and applications (e.g., tracking application), may be implemented on a console separate from the head-mounted display device. In some implementations, one console may be connected to or support more than one HMD.

In alternative configurations, different and/or additional components may be included in electronic system 1800. Similarly, functionality of one or more of the components can be distributed among the components in a manner different from the manner described above. For example, in some embodiments, electronic system 1800 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium," as used herein, refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A nano-structure, comprising:
   an outer area at an edge of the nano-structure, wherein:
      a width of the outer area defined by a distance from the edge of the nano-structure is less than 100 µm; and
      a depth of the nano-structure in the outer area changes gradually, along a trench of the nano-structure, between 0% and at least 50% of a maximum depth of the nano-structure,
   wherein the outer area is configured to limit damages to at least one of a mold or the nano-structure during the nanoimprinting.

2. The nano-structure of claim 1, wherein the depth of the nano-structure in the outer area gradually decreases towards the edge of the nano-structure.

3. The nano-structure of claim 1, wherein the maximum depth of the nano-structure is at least 100 nm.

4. The nano-structure of claim 1, wherein the depth of the nano-structure in the outer area gradually changes from 400 nm or less to 5 nm or less.

5. The nano-structure of claim 1, wherein the nano-structure comprises:
   a plurality of ridges; and
   a plurality of trenches each defined by two adjacent ridges, wherein:
      the depth of the nano-structure is defined by a depth of each of the plurality of trenches; and
      the depth of at least one trench of the plurality of trenches changes gradually in the outer area between 0% and at least 50% of a maximum depth of the at least one trench.

6. The nano-structure of claim 5, wherein at least one of the plurality of ridges has a slant angle of greater than 30°, greater than 45°, or greater than 60°.

7. The nano-structure of claim 1, wherein the nano-structure comprises a surface-relief grating configured to couple light into and/or out of a substrate, and wherein the surface-relief grating comprises a resin.

8. The nano-structure of claim 1, wherein the nano-structure comprises the mold for nano-imprint lithography, and wherein the mold comprises a resin.

9. The nano-structure of claim 1, wherein the nano-structure comprises the mold for nano-imprint lithography, and wherein the mold comprises a semiconductor, an oxide, or a metal.

10. The nano-structure of claim 1, wherein a duty cycle of the nano-structure in the outer area changes gradually between at least 10% and at least 90%.

11. The nano-structure of claim 10, wherein the duty cycle of the nano-structure gradually increases towards the edge of the nano-structure.

12. The nano-structure of claim 1, wherein the outer area surrounds less than an entire periphery of the nano-structure.

13. A method comprising:
   forming an etch mask on a substrate, wherein the etch mask comprises an outer area near an edge of the etch mask, and wherein:
      a width of the outer area defined by a distance from the edge of the etch mask is less than 100 µm;
      a duty cycle of the etch mask in the outer area changes gradually, in a same period of the etch mask, between at least 10% and at least 90%; and
   etching the substrate with the etch mask using an ion beam to form a nano-structure in the substrate, wherein the nano-structure is configured to limit damages to at least one of the nano-structure, a stamp, or a surface-relief grating during nanoimprinting.

14. The method of claim 13, wherein the duty cycle of the etch mask gradually increases towards the edge of the etch mask.

15. The method of claim 14, wherein an etch depth in the substrate gradually decreases towards an edge of the nano-structure.

16. The method of claim 15, wherein the etch depth decreases from 400 nm or less to 5 nm towards the edge of the nano-structure.

17. The method of claim 13, wherein the substrate comprises a semiconductor, an oxide, or a metal, the method further comprising:
   forming the stamp using the nano-structure in the substrate, wherein the stamp comprises a resin.

18. The method of claim 17, further comprising:
   forming the surface-relief grating using the stamp, wherein a depth of the surface-relief grating decreases gradually towards an edge of the surface-relief grating.

19. The method of claim 18, wherein the surface-relief grating comprises:
   a plurality of ridges;
   a plurality of trenches each defined by two adjacent ridges; wherein:
      the depth of the surface-relief grating is defined by a depth of each of the plurality of trenches; and
      the depth of at least one trench of the plurality of trenches gradually decreases in the outer area from at least 50% to 0% of a maximum depth of the at least one trench.

20. The method of claim 19, wherein at least one of the plurality of ridges has a slant angle of greater than 30°, greater than 45°, or greater than 60°.

* * * * *